United States Patent [19]
Matsuura

[11] Patent Number: 5,812,009
[45] Date of Patent: Sep. 22, 1998

[54] BOOST TYPE EQUALIZING CIRCUIT

[75] Inventor: Michio Matsuura, Kawasaki, Japan

[73] Assignee: Fujitsu Limited, Kawasaki, Japan

[21] Appl. No.: 557,282

[22] Filed: Nov. 14, 1995

[30] Foreign Application Priority Data

Apr. 3, 1995 [JP] Japan ................................. 7-078002

[51] Int. Cl.$^6$ .................................................. H03G 3/00
[52] U.S. Cl. ......................... 327/362; 327/334; 327/390; 327/552
[58] Field of Search ...................... 327/334, 362, 327/552, 553, 554, 555, 390, 536; 333/28; 381/98, 103; 360/65

[56] References Cited

U.S. PATENT DOCUMENTS 4,642,541  2/1987  El-Sadi ................................. 318/616
4,709,391  11/1987  Kaizer et al. ........................... 381/98
5,227,806  7/1993  Eguchi ................................... 343/765

*Primary Examiner*—Timothy P. Callahan
*Assistant Examiner*—An T. Luu
*Attorney, Agent, or Firm*—Greer, Burns & Crain, Ltd.

[57] ABSTRACT

A boost type equalizing circuit, being an equalizing circuit used in a signal reproducing circuit of memory device such as an optical disk drive and hard disk drive, and comprising boost units 4, 6, which is used for compensating distortion caused in reproduced signal of information recording medium, and compensating frequency characteristic of reproduced signal. The boost units 4, 6 are composed so that the numerator of the transfer function may have an even-number order term of fourth power or more of Laplace operator s. A boost equalizing circuit of excellent cut-off characteristic in high frequency range can be presented.

9 Claims, 32 Drawing Sheets

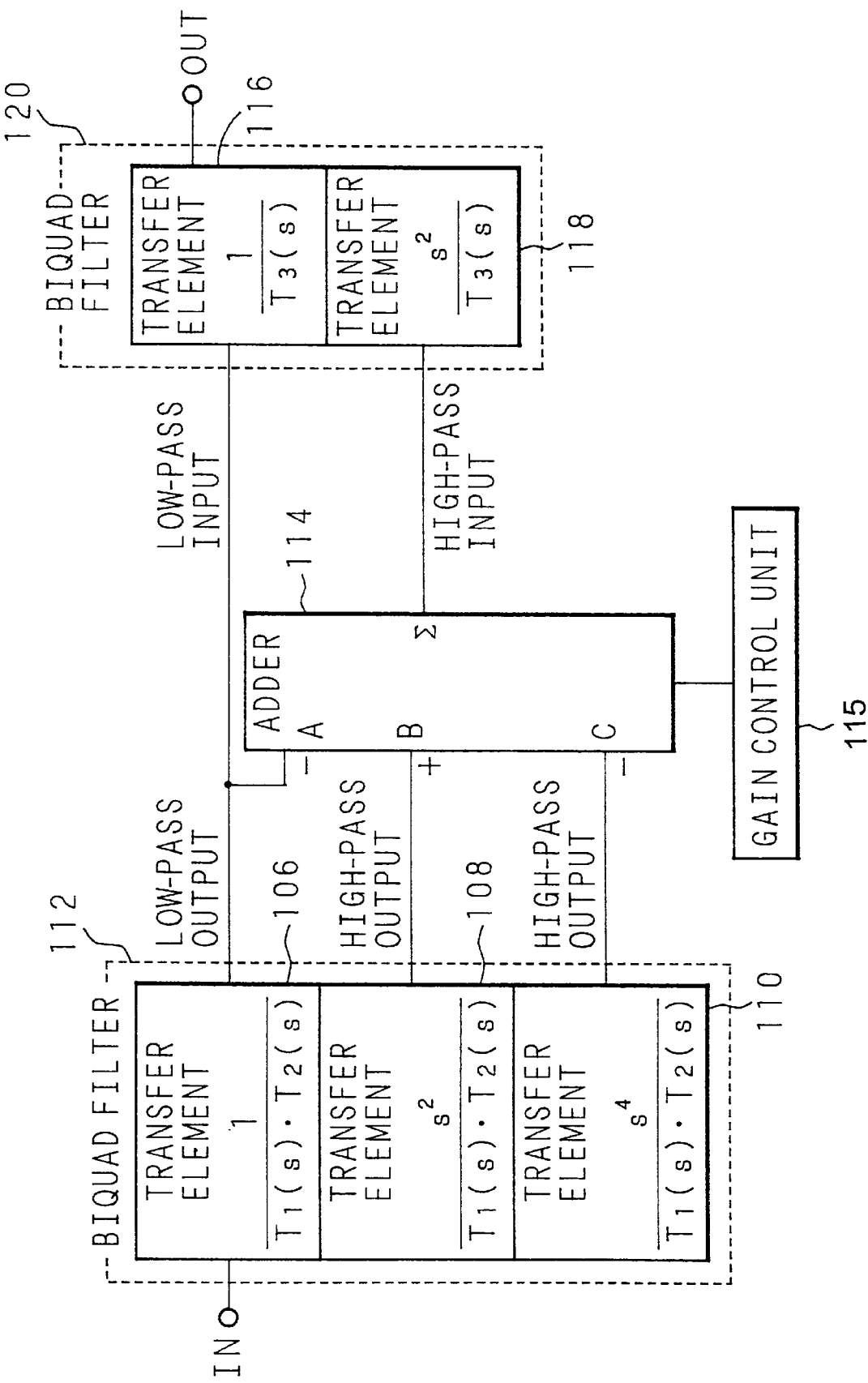

BOOST TYPE EQUALIZING CIRCUIT

BACKGROUND OF THE INVENTION

1. Field of the Invention

The present invention relates to an improvement of an equalizing circuit used in a signal reproducing circuit of a memory device such as an optical disk drive and a hard disk drive.

2. Description of the Related Art

The memory devices such as optical disk drives and hard disk drives are demanded to have a larger memory capacity along with the progress of the multimedia.

To increase the memory capacity of optical disks higher density of recorded information is needed, and it is necessary to shorten the length of pits (or bits in a hard disk drive).

However, the diameter of a light spot or the gap length of a magnetic head cannot be shortened infinitely, and, therefore, as the density is advanced, the resolution (the amplitude ratio of maximum frequency and minimum frequency of frequency components of reproduced signals) is lowered. As the resolution lowers, the amplitude of reproduced signals becomes uneven due to a decrease of high frequency components, and the amplitude lowered portion drops out or the noise effects increase, and thereby the amplitude detection margin decreases and reproduction errors increase.

To prevent such problems, the high frequency components of the reproduced signals are emphasized by an equalizing circuit, and the frequency components of the reproduced signals are corrected to be uniform in amplitude. In the hitherto used cosine equalizing circuit, however, since the boost characteristic is moderate, when the high frequency range is emphasized in order to compensate for drop in resolution, the undesired portions out of the signal band are also emphasized, and jitters due to noise increases and hence errors are increased.

Recently, to improve the error rate, PRML (Partial response Maximum Likelihood) has come to be used. In PRML, the amplitude of signal waveform is used as the basis for data judgment, and therefore the uniformity of the level over the entire signal frequency range is important. It is hence demanded to realize an advanced equalizing circuit capable of adjusting the boost quantity finely at every frequency.

Lately, from the viewpoint of LSI, a gm filter whose frequency characteristic varies by changing the voltage-current conversion gain is highly evaluated because the inductance L (coil) is not used, and the recording medium is divided into several zones in order to increase the memory capacity, and the recording and reproducing frequency can be changed in every zone (the cut-off frequency of filter is also changed) (for example, "Voltage tunable linear filter move onto a chip," Electronic Design, Feb. 8, 1990).

As an example of hitherto used boost type equalizing circuits, a boost type equalizing circuit with the numerator of transfer function "$1-K_1*s^2$" (here $K_1$ is an arbitrary coefficient) is known. To determine its frequency characteristic, by substituting "$s=j\omega$" (where $\omega=2\pi f$, $j^2=-1$), the boost characteristic is "$1+K_1*\omega^2$". FIG. 1 is a characteristic diagram showing its typical ($K_1=1$) frequency characteristic.

FIG. 2 is a block diagram showing a constitution of an example of a boost type equalizing circuit having such frequency characteristic. In this boost type equalizing circuit, an input signal IN is supplied to a transfer element 122 of transfer function "$\omega_1^2/(s^2+\omega_1/Q*s+\omega_1^2)$" and a transfer element 124 of transfer function "$K*s^2/(s^2+\omega_1/Q*s+\omega_1^2)$", and an output signal of the transfer element 122 and the output signal of the transfer element 124 are subtracted at a subtraction point 126, and a difference is obtained. The obtained difference is outputted as an output signal OUT of the boost type equalizing circuit through a low-pass filter of transfer function "T(s)".

Herein, the entire transfer function of the boost type equalizing circuit becomes "$\{1-K(s/\omega_1)^2\}*\{\omega_1^2/(s^2+\omega_1/Q*s+\omega_1^2)\}*T(s)$". More specifically, "$\{1-K(s/\omega_1)^2\}$" is the boost characteristic, and by substituting "$s=j\omega$", it is rewritten as "$1+K*\omega^2/\omega_1^2$", which is the square characteristic of "$\omega$" (square characteristic of s).

"$\{\omega_1^2/(s^2+\omega_1/Q*s+\omega_1^2)\}*T(s)$" is composed so as to be a constant delay characteristic of low-pass filter or the like such as Bessel characteristic.

FIG. 3 is a circuit diagram showing an example of using an LC circuit of such boost type equalizing circuit (used in a hard disk drive or the like, actually constituted as a differential circuit). In this boost type equalizing circuit, an input signal IN is supplied to a voltage-current converter 130 having a voltage-current conversion gain "gm=1", and a voltage-current converter 132 having a voltage-current conversion gain "gm=A". An output current of the voltage-current converter 130 is supplied to a connection node of L1 and C1 of a first stage of a ladder circuit of inductance L and capacitance C, and the input current of the voltage-current converter 132 is given from a connection node of L1 of the first stage and C2 and L2 of a second stage of the ladder circuit. The output side of the L2 of the second stage is connected to C3 whose other side is grounded, and to resistance R, and is formed as an output terminal of the boost type equalizing circuit.

The transfer function "T(s)" of such boost type equalizing circuit is as follows.

$$T(s) = \frac{\{-A(L1*C1)s^2 + (1-A)\}}{\{Cs^5 + Ds^4 + Es^3 + Fs^2 + Gs + 1\}}$$

where, C=R*L1*L2*C1*C2*C3
D=L1*L2*C1*C2
E=R(L1*C1*C3+L2*C1*C3+L1*C2*C3+L2*C2*C3)
F=L1*C1+L2*C1+L2*C2
G=R(C1+C2+C3)

FIG. 4 is a block diagram showing a constitution of a differential addition type of an example of a boost type equalizing circuit having square characteristic of "ω" (used in large capacity magnetic tape device or the like). In this boost type equalizing circuit, an input signal IN is supplied to a transfer element 134 of transfer function "a*s", and the input signal IN and the output signal of the transfer element 134 are added at an addition point 136. The added signal is supplied to a transfer element 138 of transfer function "b*s", and the difference of the added signal and an output signal of the transfer element 138 is obtained at a subtraction point 140. Obtained difference is outputted as an output signal OUT of the boost type equalizing circuit through a low-pass filter 142.

The transfer function of the boost type equalizing circuit excluding the low-pass filter 142 becomes "$T(s)=1+(a-b)s-abs^2$", and assuming "a=b", the term of "s" is eliminated, and a high frequency boost characteristic of "$s^2$" only is obtained. Substituting "$s=j\omega$" yields "$1+ab\omega^2$", which is a square characteristic of "ω".

FIG. 5 is a block diagram showing a constitution of a cosine equalizer using a delay line of an example of a boost type equalizing circuit (widely used before the LSI age). In this boost type equalizing circuit, an input signal IN is supplied to a delay line 144 of delay time "Td", and a boost circuit 150 having gain "k", and the output of the delay line 144 is further supplied to a delay line 146 of delay time "Td". The output of the delay line 146 is supplied to a boost circuit 148 having gain "k".

The output of the delay line 144, output of the boost circuit 148, and output of the boost circuit 150 are supplied to a subtraction point 152, and the output of the boost circuit 148 and output of the boost circuit 150 are subtracted from the output of the delay line 144. The output of the subtraction point 152 is outputted as an output signal OUT of the boost type equalizing circuit through a low-pass filter 154.

The transfer characteristic of this boost type equalizing circuit excluding the low-pass filter 154 is "$T(\omega)=1-2k \cdot \cos(\omega \cdot Td)$" (where $\omega=2\pi f$), and although a term of square of s does not appear directly, the boost characteristic is about "$1+\omega^2$".

The objects of these boost type equalizing circuits may be summarized into the following points.

(a) The signal amplitude is made to be uniform over a specific frequency range.

(b) Isolated waveforms are corrected in order to minimize the interference between bits (pulse slimming).

(c) The signal band is limited to a minimum requirement, and noise is reduced (undesired spectrum is cut off as far as possible).

A reproduced signal is a random bit row, and its frequency component, called spectrum, distributes widely in a specific band. It is a principal role of a boost type equalizing circuit to correct the deterioration of high frequency range caused in the recording process and frequency characteristic of reproduction pickup by its reverse frequency characteristic, and limit to a band of minimum requirement.

Therefore, to achieve the object (a), matching with an idealizing characteristic in an intermediate frequency range is important, and for the object (b), the emphasis of high frequency range is important, and for the object (c), the characteristic for abruptly cutting off over the required band is important.

Generally, the objects (b) and (c) are in a trade-off relation, but in the boost type equalizing circuit, actually, there are restrictions in the applicable circuit system (cost, space, suitability to LSI, etc.). Moreover, in the conventional boost type equalizing circuit, the boost characteristic is "$\omega^2$" only, and it is hard to satisfy conditions of both object (b) and object (c) (emphasizing the high frequency range to a certain extent, and cutting off suddenly) simultaneously, and in particular, when the resolution is further lowered in high density recording, the drop of high frequency range is sudden, and the effect of the boost type equalizing effect is lost.

SUMMARY OF THE INVENTION

The invention has been devised in the light of the above circumstances, and it is an object of first to fourth aspects thereof to provide a boost type equalizing circuit excellent in the cut-off characteristic in the high frequency range, by comprising a boost unit having an even-number order term of fourth power or more of Laplace operator s as the numerator of the transfer function.

It is an object of fifth to eighth aspects thereof to provide a boost type equalizing circuit increased in the flexibility of equalizing characteristic design and excellent in the cut-off characteristic in the high frequency range, by comprising a boost unit having boost coefficient controlling means for varying independently the boost coefficients of the terms of second power, fourth power, and sixth power of Laplace operator s.

It is an object of a ninth aspect to provide a boost type equalizing circuit low in noise and excellent in the cut-off characteristic in the high frequency range, by comprising a boost unit having a plural differential amplifying circuits.

In the boost type equalizing circuit of the invention, in order to improve the sharpness of high frequency range (cut-off characteristic), a higher order term of "$\omega$" (here, $\omega=2\pi f$) is introduced into the boost characteristic of the boost type equalizing circuit (the boost characteristic is emphasized of its tendency (tilt angle, etc.) as "$\omega$" becomes higher in order). Herein, in order that the numerator of the transfer function may not have effect on the delay characteristic, it is required that s be an even-number order (so that "$j(j^2=-1)$" may not be left over when substituting by "$s=j\omega$").

Therefore, the order of "$\omega$" is also an even-number order only, and the boost type equalizing circuit of the invention is characterized in that the boost characteristic has an even-number order term of the fourth power of "$\omega$" or more.

FIG. 6 is a characteristic diagram showing an example of a frequency characteristic containing "$\omega^2 (s^2)$" and an example of a frequency characteristic containing "$\omega^4 (s^4)$". The frequency characteristic containing "$\omega^4$" changes more sharply near the cut-off frequency than the frequency characteristic containing "$\omega^2$", and a sharp boosting can be realized, and it is known that signals over the required band can be cut off suddenly.

In FIG. 6, for example, supposing that the "$1+\omega^4$" characteristic to be an idealizing characteristic (the characteristic in which the amplitude of all frequencies becomes uniform after equalizing), the "$1+\omega^2$" characteristic is insufficient in the degree of emphasis in the high frequency range, and hence it cannot be matched with the idealizing characteristic ("$1+\omega^4$" characteristic).

In this case, concerning frequencies at, for example, points a, b and c, the idealizing characteristic and "$1+\omega^2$" characteristic are nearly matched in amplitude at points a and b, but at point c, the amplitude of "$1+\omega^2$" characteristic cannot be corrected to be the amplitude of the idealizing characteristic. When attempted to match by force at point c, the amplitude of the "$1+\omega^2$" characteristic at points a and b becomes larger than the amplitude of the idealizing characteristic, and the change near the cut-off frequency becomes moderate, and the cut-off characteristic is poor. Therefore, it is known that the "$1+\omega^4$" characteristic can improve the sharpness of high frequency range (cut-off characteristic) as compared with the "$1+\omega^2$" characteristic.

In the boost type equalizing circuit of the first to fourth aspects of the invention, the numerator of the transfer function of the boost unit has an even-number order term of the fourth power or more of the Laplace operator s, and therefore the change near the cut-off frequency is sharp, and signals over the required band are cut off suddenly.

In the boost type equalizing circuit of the fifth to eighth aspects, the boost coefficient control means changes independently the boost coefficients of the terms of the square, fourth power, and sixth power of Laplace operator s, and therefore the adjustment of the equalizing characteristic is easy. Hence, the degree of freedom of the equalizing characteristic design is increased, and the boost type equalizing circuit excellent in cut-off characteristic in the high frequency range is realized.

In the boost type equalizing circuit of the ninth aspect, since the boost unit has a plural differential amplifying circuits and signals of mutually reverse phases are processed inside, noise is eliminated, so that the boost type equalizing circuit small in noise and excellent in cut-off characteristic of high frequency range is realized.

The above and further objects and features of the invention will more fully be apparent from the following detailed description with accompanying drawings.

BRIEF DESCRIPTION OF THE DRAWINGS

FIG. 28 is a block diagram showing a constitution of an embodiment according to an eighth aspect of a boost type equalizing circuit according to the invention;

DESCRIPTION OF THE PREFERRED EMBODIMENTS

Figure 1:
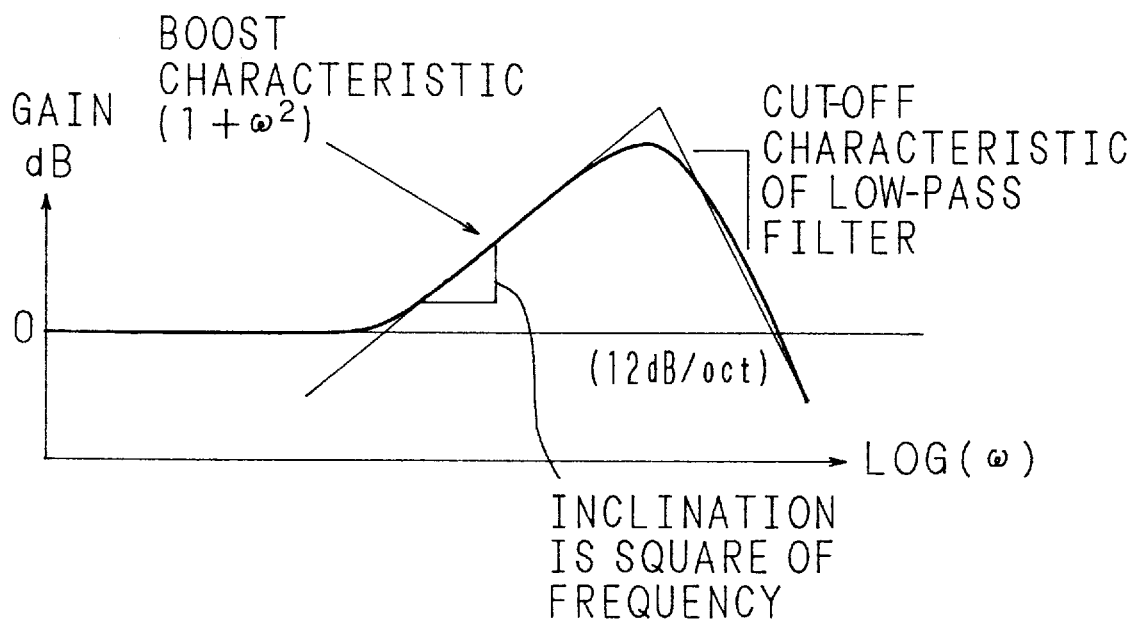
FIG. 1 is a characteristic diagram showing a characteristic of a conventional boost type equalizing circuit.
Figure 2:
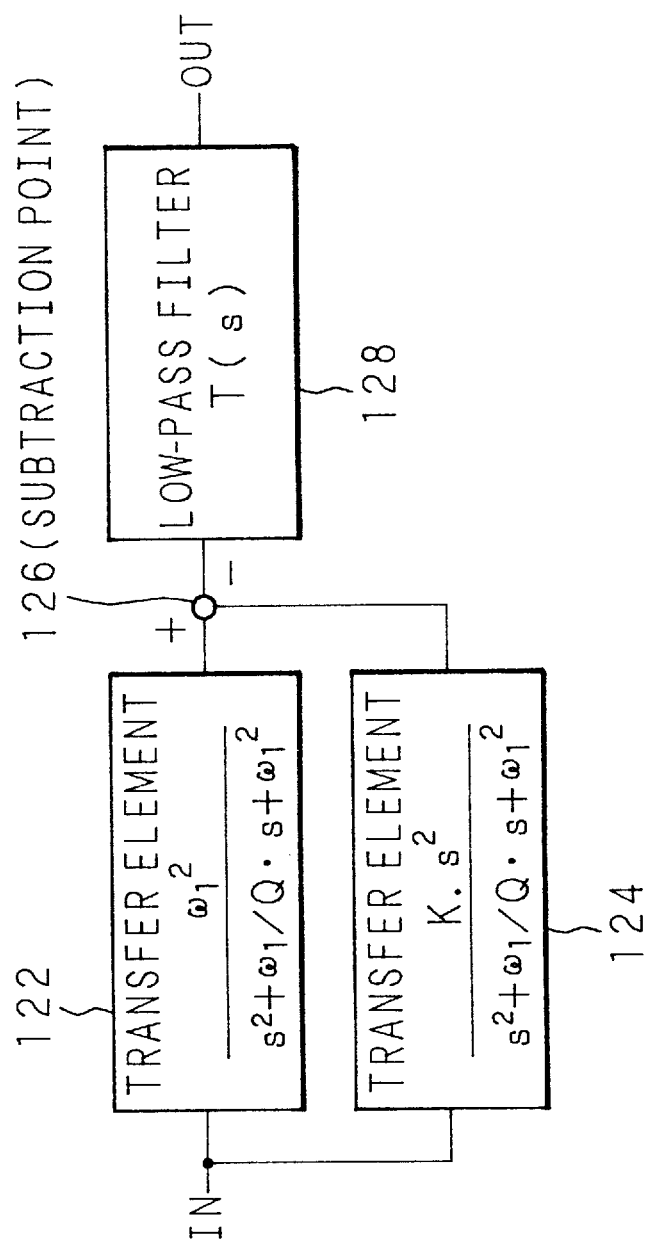
FIG. 2 is a block diagram showing a constitution of an example of a conventional boost type equalizing circuit.
Figure 3:
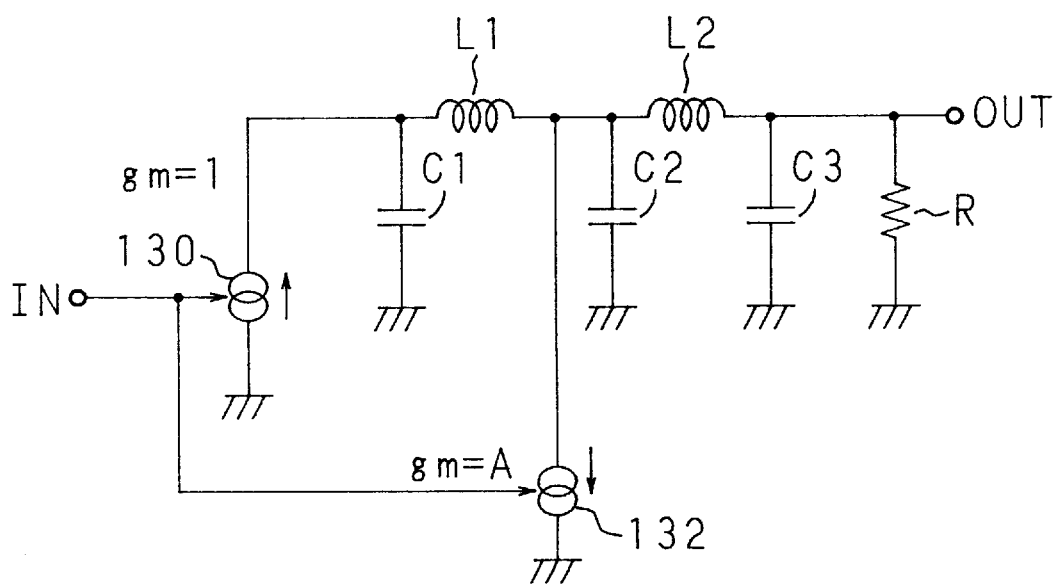
FIG. 3 is a circuit diagram showing the constitution of the boost type equalizing circuit shown in FIG. 2.
Figure 4:
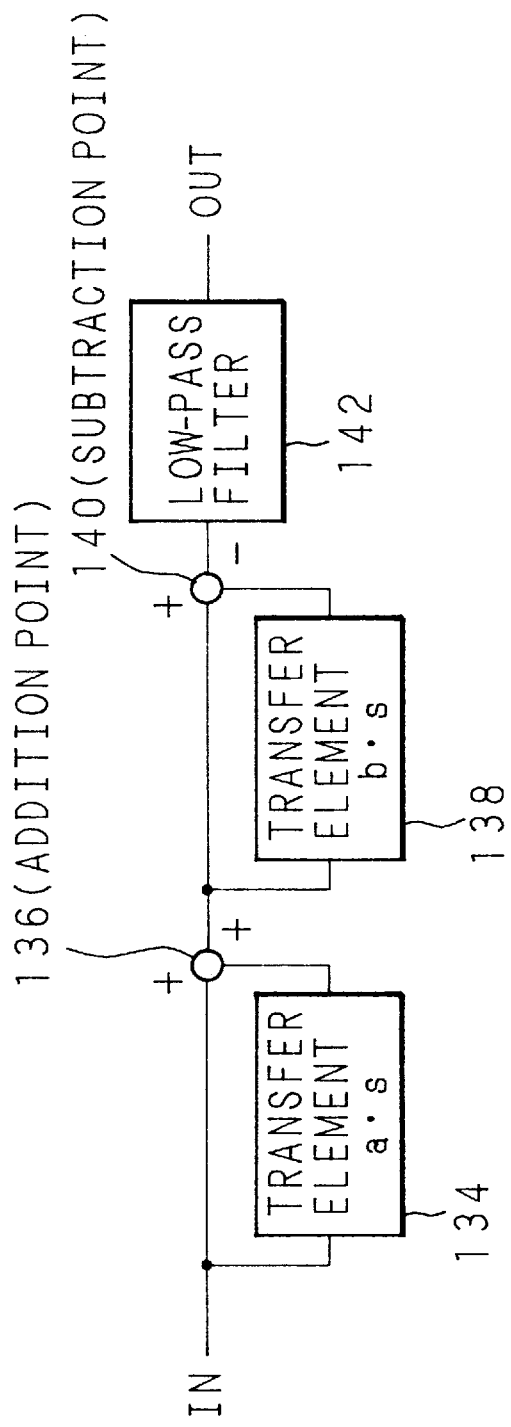
FIG. 4 is a block diagram showing a constitution of other example of a conventional boost type equalizing circuit.
Figure 5:
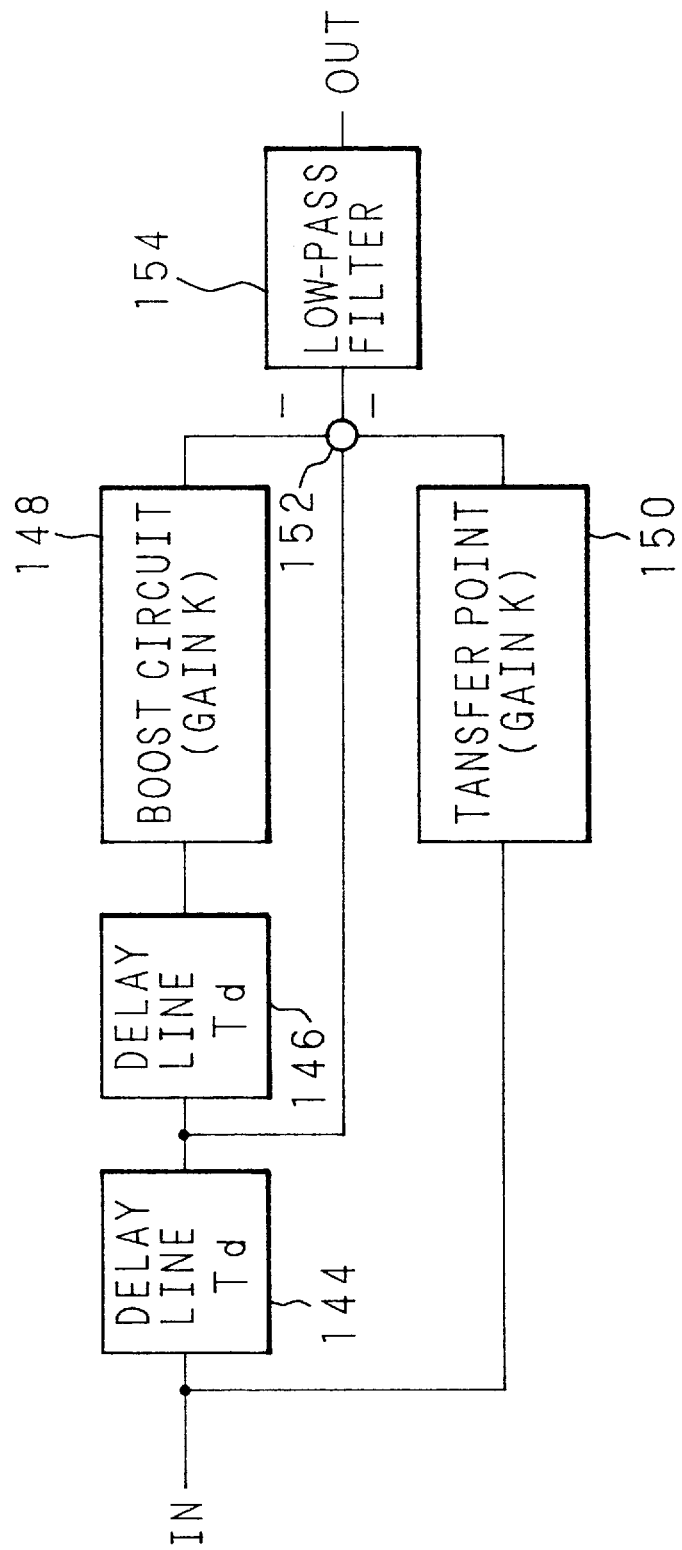
FIG. 5 is a block diagram a constitution of other example of a conventional boost type equalizing circuit.
Figure 6:
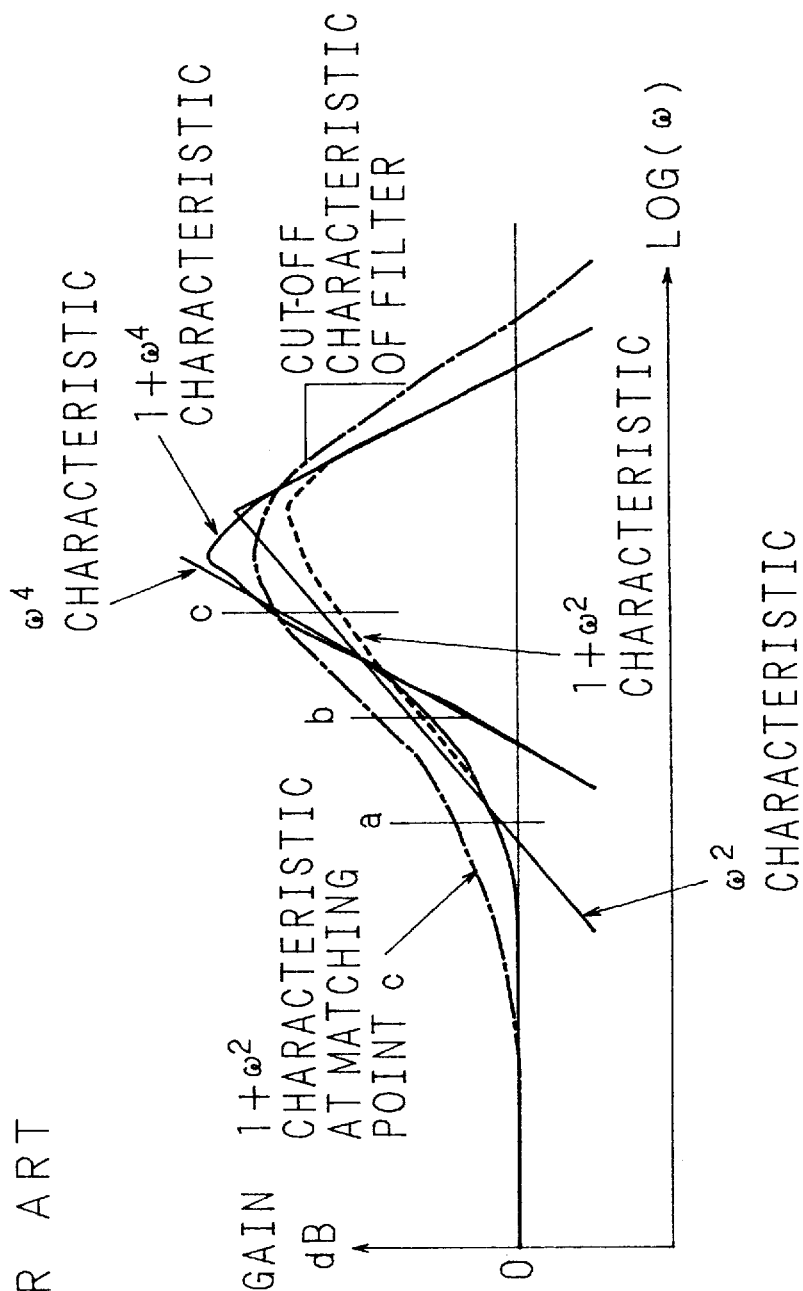
FIG. 6 is an explanatory diagram for explaining the difference between a boost characteristic of fourth power of "ω" and a boost characteristic of square of "ω"

Referring now to the drawings, some of the embodiments of the invention are described in detail below.

[First Embodiment]

Figure 7:
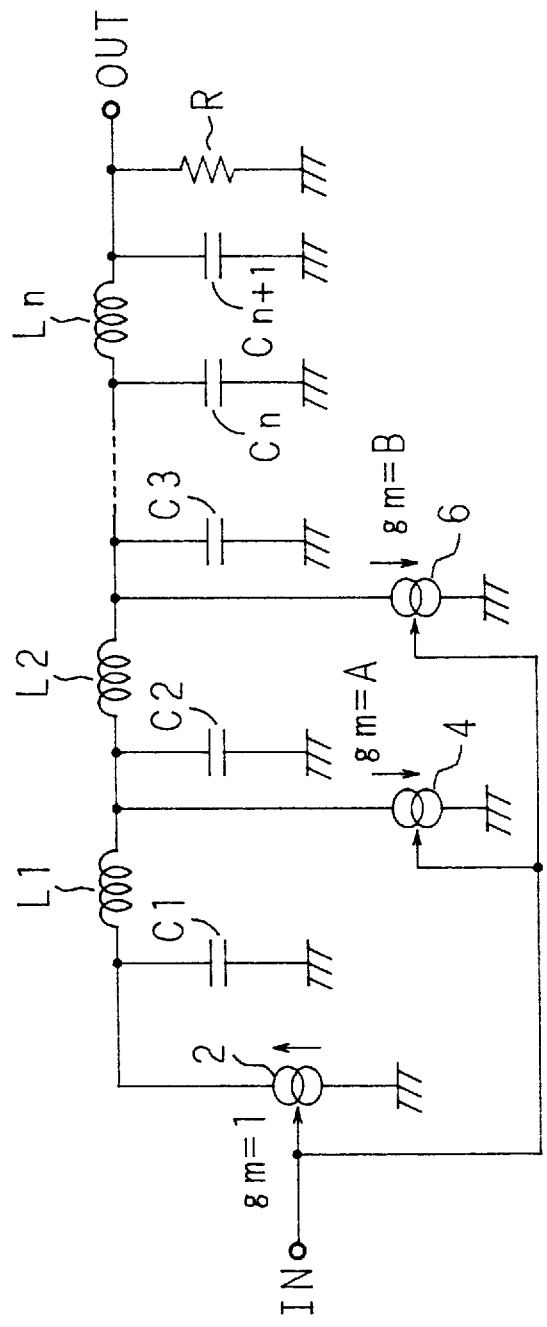
FIG. 7 is a circuit diagram showing a constitution of an embodiment according to first and second aspects of a boost type equalizing circuit according to the invention.

FIG. 7 is a circuit diagram showing a constitution of an embodiment according to first and second aspects of a boost type equalizing circuit according to the invention. In this boost type equalizing circuit, an input signal IN is supplied, for example, to a voltage-current converter 2 having a voltage-current conversion gain "gm=1", a voltage-current converter 4 having a voltage-current conversion gain "gm=A", and a voltage-current converter 6 having a voltage-current conversion gain "gm=B".

The output current of the voltage-current converter 2 is supplied to a connection node of L1 and C1 of a first stage of a ladder circuit of inductance L and capacitance C, and the output current of the voltage-current converter 4 is supplied to a connection node of L1 of the first stage and C2 and L2 of a second stage of the ladder circuit, and the output current of the voltage-current converter 6 is supplied to a connection node of L2 of the second stage and C3 and L3 of a third stage of the ladder circuit.

The output side of Ln of n-th stage of the ladder circuit of inductance L and capacitance C is connected to Cn+1, whose other side is grounded, and a resistance R, and is formed to be an output terminal of the boost type equalizing circuit. Meanwhile, when the order number (number of stages) of the filter is an even number, Cn+1 can be omitted.

Figure 8A:
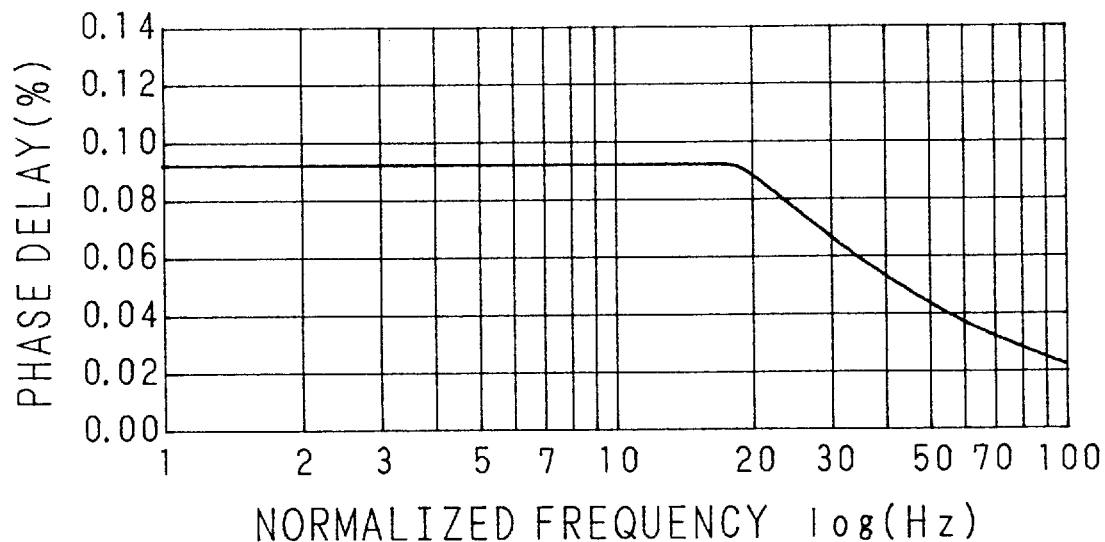
FIG. 8A and FIG. 8B are characteristic diagrams showing characteristics of the boost type equalizing circuit shown in FIG. 7.

FIG. 8A is a characteristic diagram showing a delay characteristic of this boost type equalizing circuit, in which the axis of abscissas denotes the normalized frequency and the axis of ordinates represents the rate of phase delay. The phase delay is constant in the frequency band below the cut-off frequency.

Figure 8B:
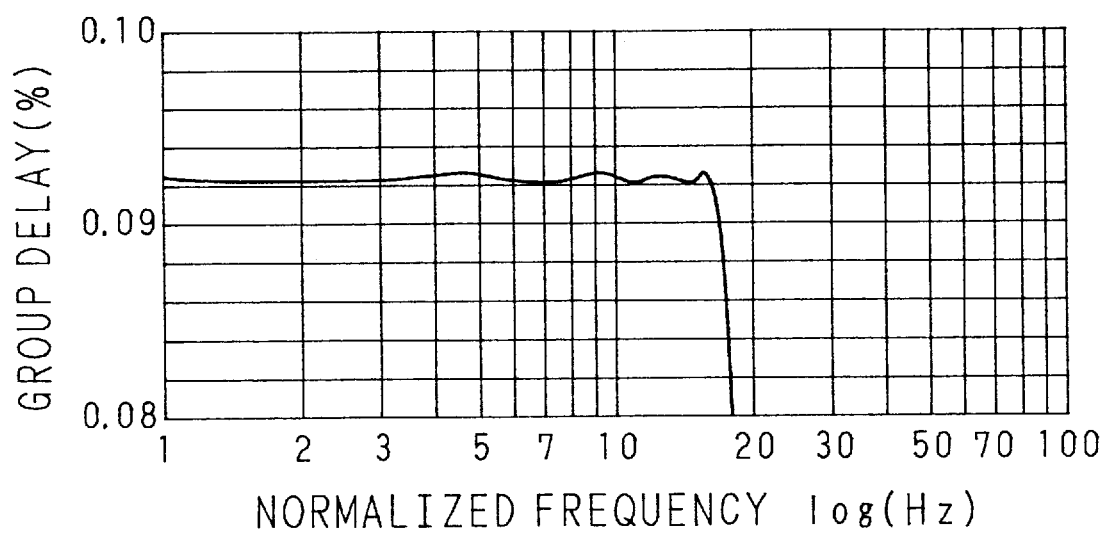

FIG. 8B is a characteristic diagram showing a group delay characteristic of this boost type equalizing circuit, in which the axis of abscissas denotes the normalized frequency and the axis of ordinates represents the rate of group delay. The group delay is nearly constant in the frequency band below the cut-off frequency.

Figure 9A:
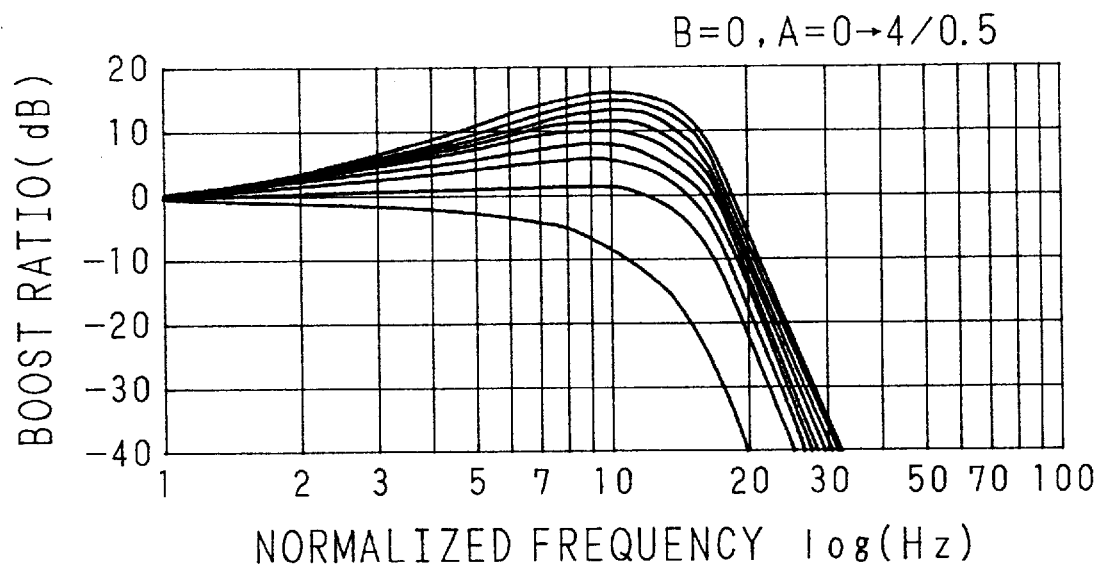
FIG. 9A and FIG. 9B are characteristic diagrams showing characteristics of the boost type equalizing circuit shown in FIG. 7.

FIG. 9 A shows a frequency characteristic of the boost type equalizing circuit, in which the voltage-current conversion gain "A" of the voltage-current converter 4 varies from 0 to 4 at 0.5 steps at the voltage-current conversion gain "B=0" of the voltage-current converter 6.

The axis of abscissas denotes the normalized frequency and the axis of ordinates represents the boost ratio. The larger the voltage-current conversion gain "A", the better is the boost characteristic in the high frequency range, but the cut-off characteristic is invariable.

Figure 9B:
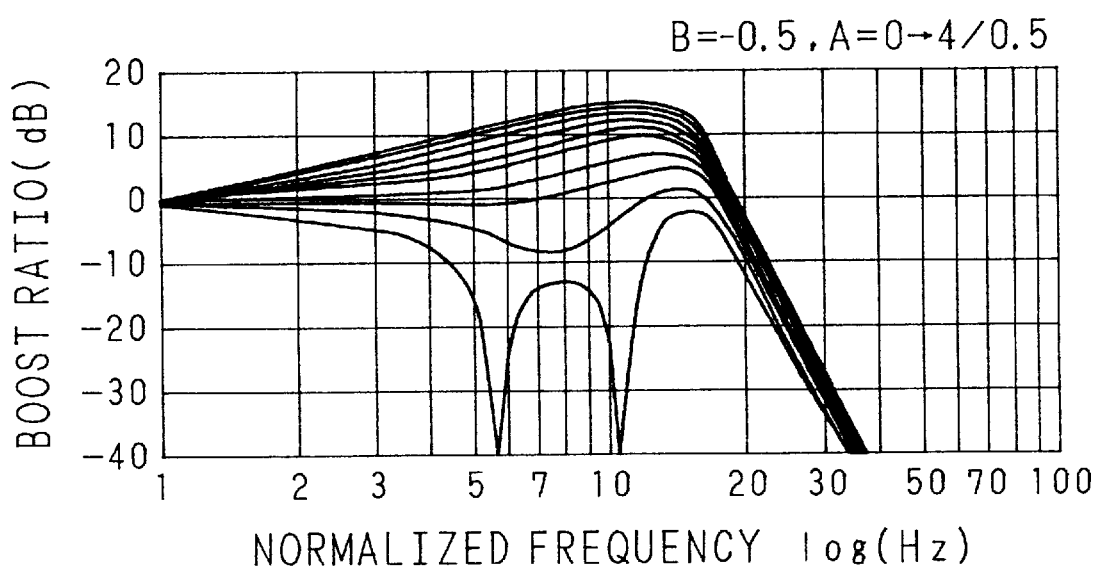

FIG. 9B is a characteristic diagram, in which the voltage-current conversion gain "A" of the voltage-current converter 4 varies from 0 to 4 at 0.5 steps at the voltage-current conversion gain "B=−0.5" of the voltage-current converter 6. The larger the voltage-current conversion gain "A", the better is the boost characteristic in the high frequency range, and the cut-off characteristic is also superior. When the voltage-current conversion gain "A" is small, it is not suited to a boost type equalizing circuit.

Figure 10:
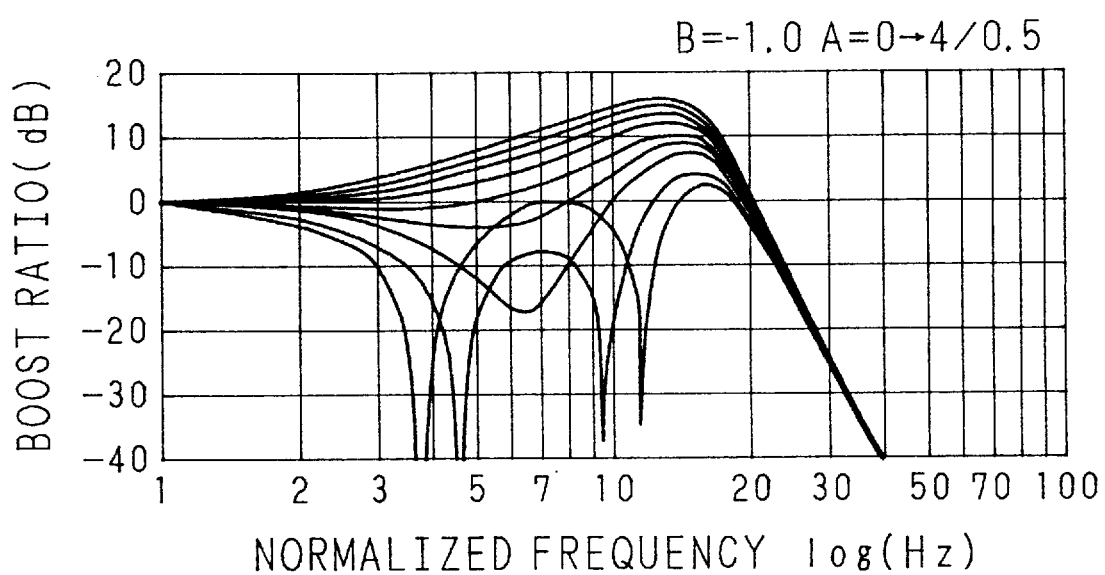
FIG. 10 is a characteristic diagram showing a characteristic of the boost type equalizing circuit shown in FIG. 7.

FIG. 10 is a characteristic diagram, in which the voltage-current conversion gain "A" of the voltage-current converter 4 varies from 0 to 4 at 0.5 steps at the voltage-current conversion gain "B=−1.0" of the voltage-current converter 6. The larger the voltage-current conversion gain "A", the better is the boost characteristic in the high frequency range, and the cut-off characteristic is also superior. When the voltage-current conversion gain "A" is small, it is not suited to a boost type equalizing circuit.

[Second Embodiment]

Figure 11:
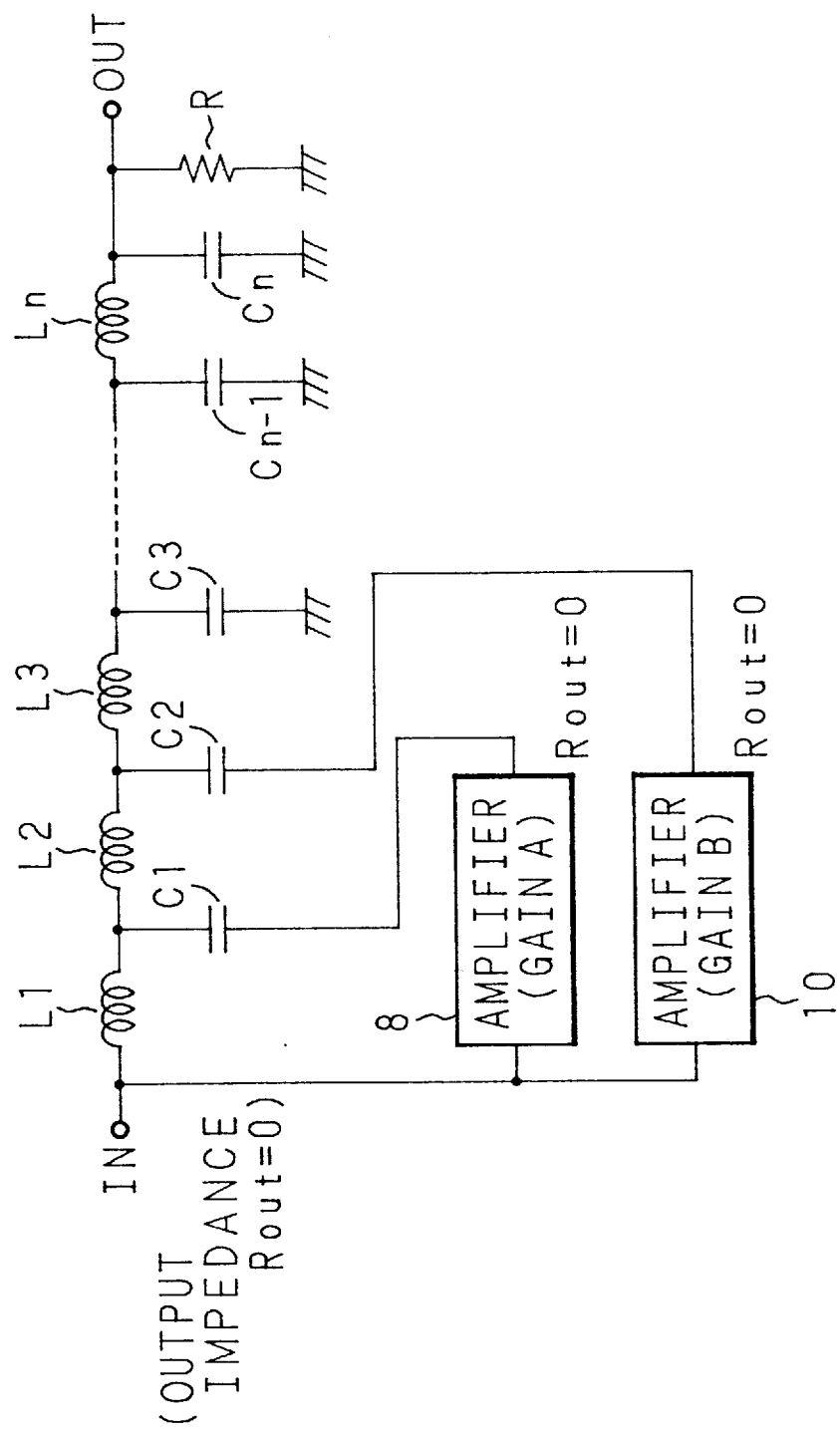
FIG. 11 is a circuit diagram showing a constitution of an embodiment according to a third aspect of a boost type equalizing circuit according to the invention.

FIG. 11 is a circuit diagram showing a constitution of another embodiment of a third aspect of a boost type equalizing circuit of the invention. In this boost type equalizing circuit, an input signal IN is supplied to an amplifier 8 (boost circuit) having gain "A", an amplifier 10 (boost circuit) having gain "B", and L1 of a first stage of a ladder circuit of inductance L and capacitance C.

The output voltage of the amplifier 8 is supplied to C1 of the first stage of the ladder circuit, and the output voltage of the amplifier 10 is supplied to C2 of a second stage of the ladder circuit.

The output side of Ln of n-th stage of the ladder circuit is connected to a resistance R whose other side is grounded, and is formed as an output terminal of the boost type equalizing circuit. The output impedance of the boost type equalizing circuit and amplifiers 8, 10 is assumed to be 0. When the order number (number of stages) of the filter is an even number, Cn is omitted.

The boost characteristic of such a boost type equalizing circuit includes square (square of s) and fourth power (fourth power of s) of "ω", but does not include odd-number power of "ω" (odd-number power of s).

Figure 12A:
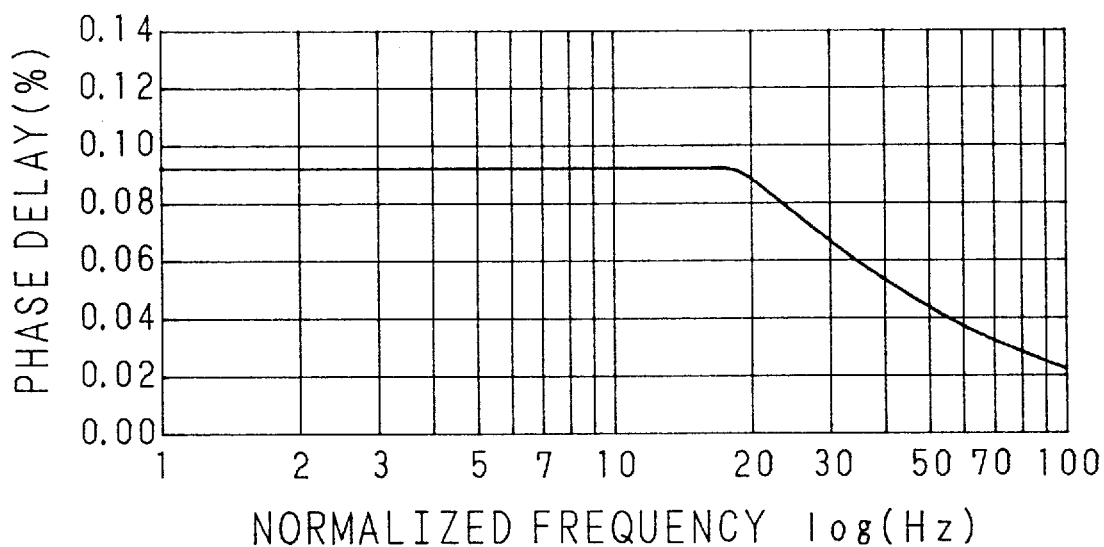
FIG. 12A and FIG. 12B are characteristic diagrams showing characteristics of the boost type equalizing circuit shown in FIG. 11.

FIG. 12A is a characteristic diagram showing a delay characteristic of this boost type equalizing circuit, in which the axis of abscissas denotes the normalized frequency, and the axis of ordinates represents the rate of phase delay. The phase delay is constant in the frequency band below the cut-off frequency.

Figure 12B:
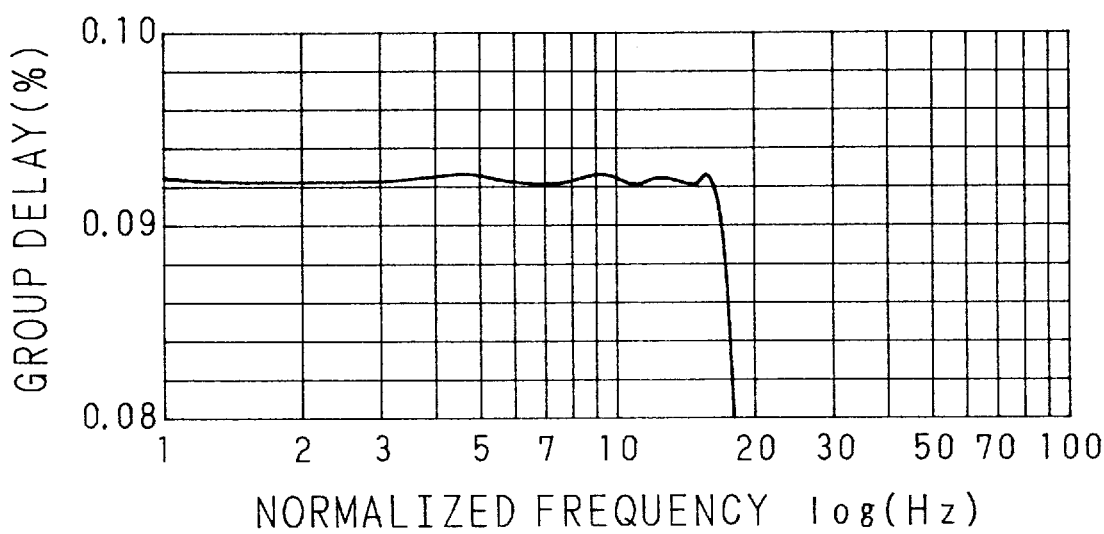
Figure 13A:
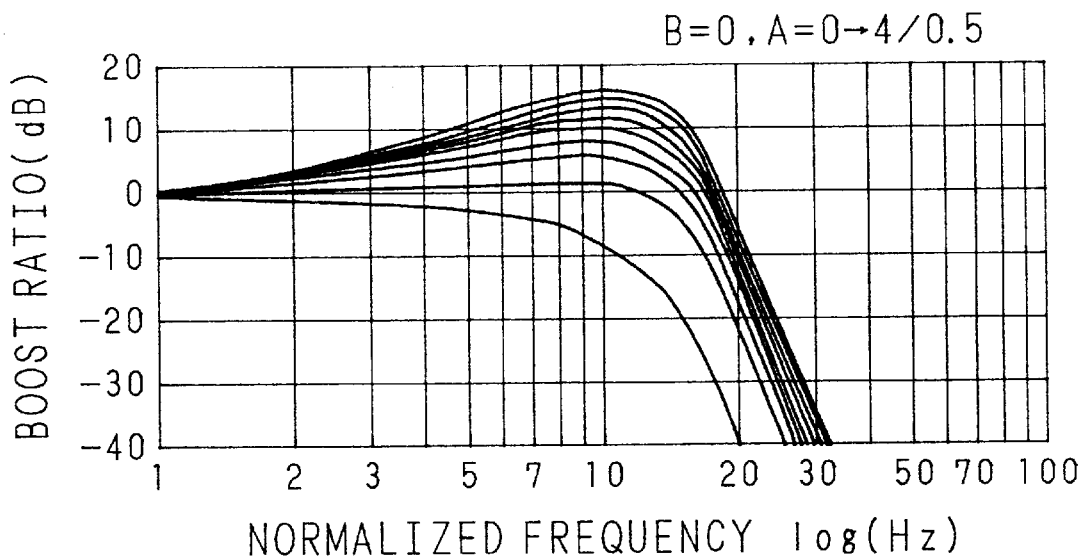
FIG. 13A and FIG. 13B are characteristic diagrams showing characteristics of the boost type equalizing circuit shown in FIG. 11.

FIG. 12B is a characteristic diagram showing a group delay characteristic of this boost type equalizing circuit, in which the axis of abscissas denotes the normalized frequency, and the axis of ordinates represents the rate of group delay. The group delay is nearly constant in the frequency band below the cut-off frequency, FIG. 13A shows a frequency characteristic of the boost type equalizing circuit, in which the gain "A" of the amplifier 8 is varied from 0 to 4 at 0.5 steps at gain "B=0" of the amplifier 10. The axis of abscissas denotes the normalized frequency, and the axis of ordinates represents the boost ratio. The larger the gain "A", the better is the boost characteristic in the high frequency range, but the cut-off characteristic does not vary.

Figure 13B:
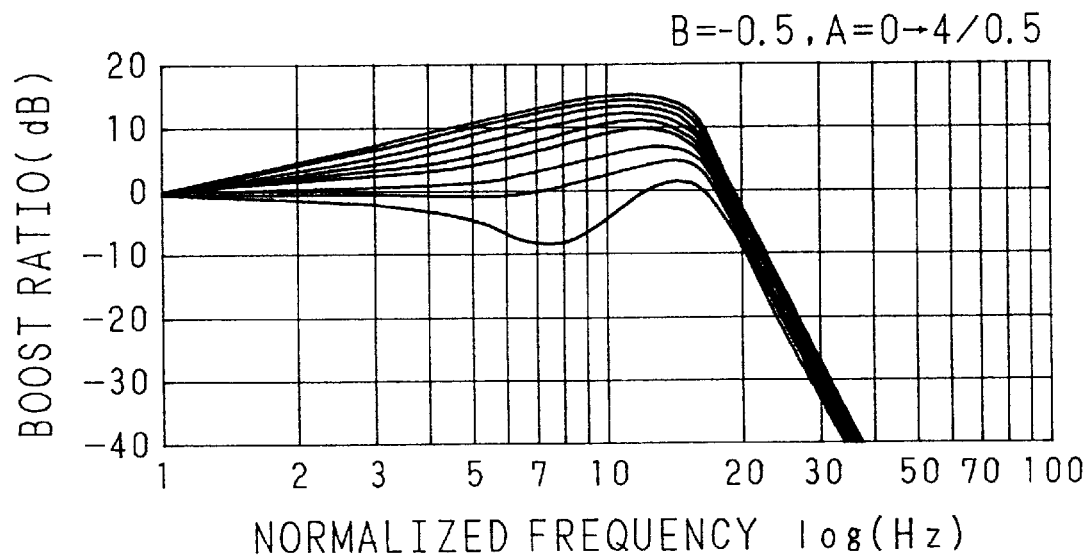

FIG. 13B is a characteristic diagram, in which the gain "A" of the amplifier 8 changes from 0 to 4 at 0.5 steps at gain "B=−0.5" of the amplifier 10. The larger the gain "A", the better is the boost characteristic in the high frequency range, and the cut-off characteristic is also superior. When the gain "A" is small, it is not suited to a boost type equalizing circuit.

Figure 14:
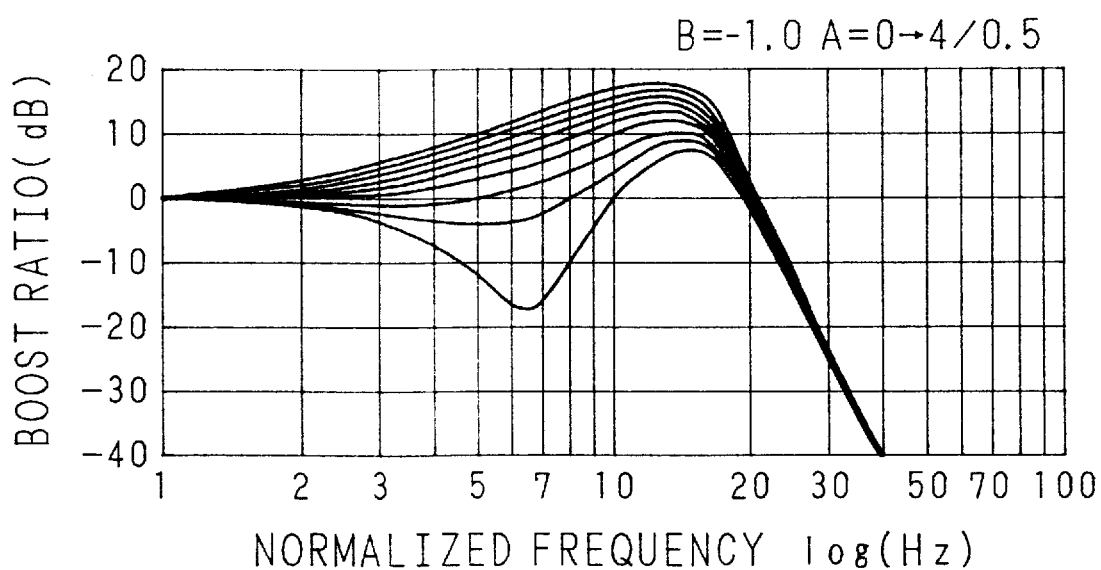
FIG. 14 is a characteristic diagram showing a characteristic of the boost type equalizing circuit shown in FIG. 11.

FIG. 14 is a characteristic diagram, in which the gain "A" of the amplifier 8 is varied from 0 to 4 at 0.5 steps at gain "B=−1.0" of the amplifier 10. The larger the gain "A", the better is the boost characteristic in the high frequency range, and the cut-off characteristic is also superior. When the gain "A" is small, it is not suited to a boost type equalizing circuit.

[Third Embodiment]

Figure 15:
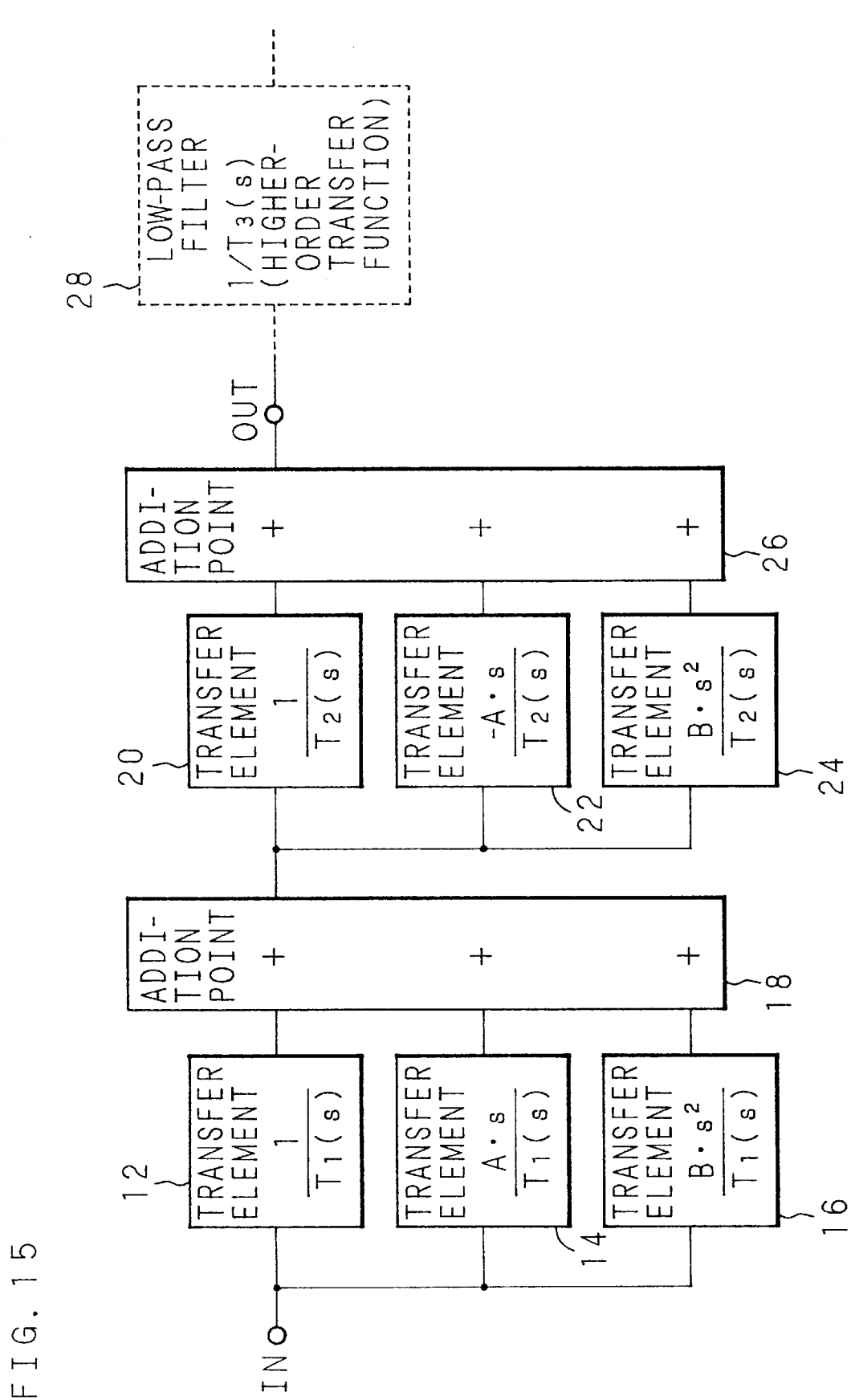
FIG. 15 is a block diagram showing a constitution of an embodiment according to a fourth aspect of a boost type equalizing circuit according to the invention.

FIG. 15 is a block diagram showing a constitution of one embodiment of a fourth aspect of a boost type equalizing circuit of the invention. In this boost type equalizing circuit, a boost circuit is added to a part of a high order low-pass filter such as a Bessel characteristic low-pass filter or a constant delay ripple filter, and it is suited to LSI structure.

In this boost type equalizing circuit, an input signal IN is supplied to a transfer element 12 of transfer function "$1/T_1(s)$", a transfer element 14 of transfer function "$A*s/T_1(s)$", and a transfer element 16 of transfer function "$B*s^2/T_1(s)$", and the outputs of these transfer elements 12, 14, 16 are added at an addition point 18.

The output of the addition point 18 is supplied to a transfer element 20 of transfer function "$1/T_2(s)$", a transfer element 22 of transfer function "$-A*s/T_2(s)$", and a transfer element 24 of transfer function "$B*s^2/T_2(s)$", and the outputs of these transfer elements 20, 22, 24 are added up at an addition point 26.

The output of the addition point 26 is outputted as an output signal OUT of the boost type equalizing circuit, through a high order low-pass filter 28 having a high order transfer function "$1/T_3(s)$".

The boost characteristic (numerator of transfer function) of this boost type equalizing circuit is expressed by the numerator of a following transfer function.

$$\frac{1 - (A^2 - 2B)s^2 + B^2*s^4}{T_1(s)*T_2(s)}$$

The transfer function is distributed so that the entire "$T_1(s)_1*T_2(s)*T_3(s)$" forms the denominator of constant delay characteristic of the Bessel characteristic low-pass filter or the like.

Figure 16:
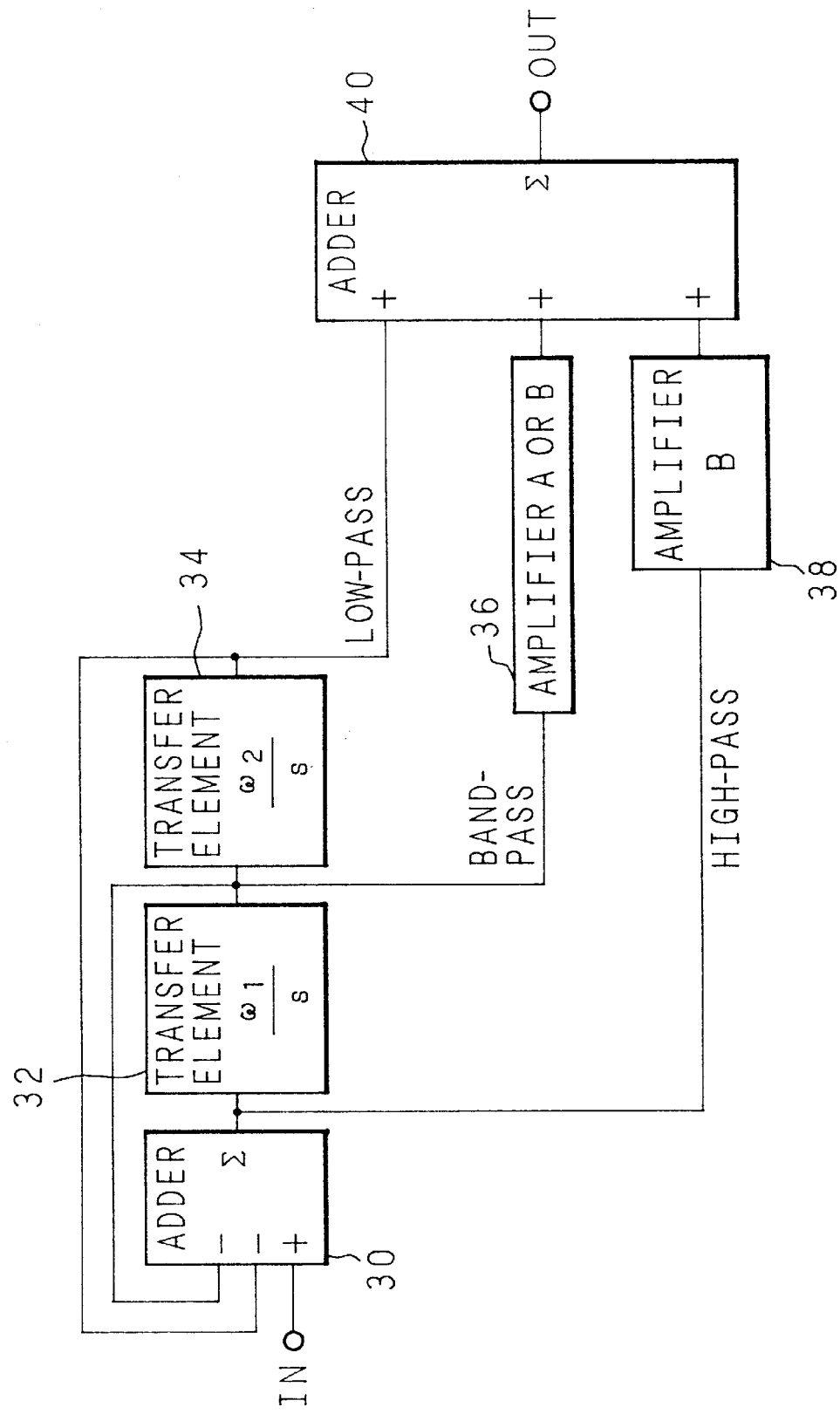
FIG. 16 is a block diagram showing a constitution example of a status variable type circuit.

A practical circuit of the boost type equalizing circuit is composed by cascade connection of two stages of status variable type circuit (biquad type circuit) shown in FIG. 16. In this status variable type circuit, the input signal IN having passed through an adder 30 (addition point or subtraction point) is supplied to the transfer element 32 of transfer function "$\omega_1/s$", and to an amplifier 38 of gain "B" as an output of high-pass filter. The output of the transfer element 32 is negatively fed back to the adder 30, and is also supplied to the transfer element 34 of transfer function "$\omega_2/s$", and to an amplifier 36 of gain "A" or "−A" as an output of band pass filter.

The output of the transfer element 34 is negatively fed back to the adder 30, and is supplied to an adder 40 as the output of low-pass filter. The adder 40 adds the inputs from the amplifiers 36, 38, and transfer element 34, and outputs the result as an output signal of the status variable type circuit.

This status variable type circuit can simultaneously take out the outputs of the low-pass filter, band pass filter, and high-pass filter.

Figure 17:
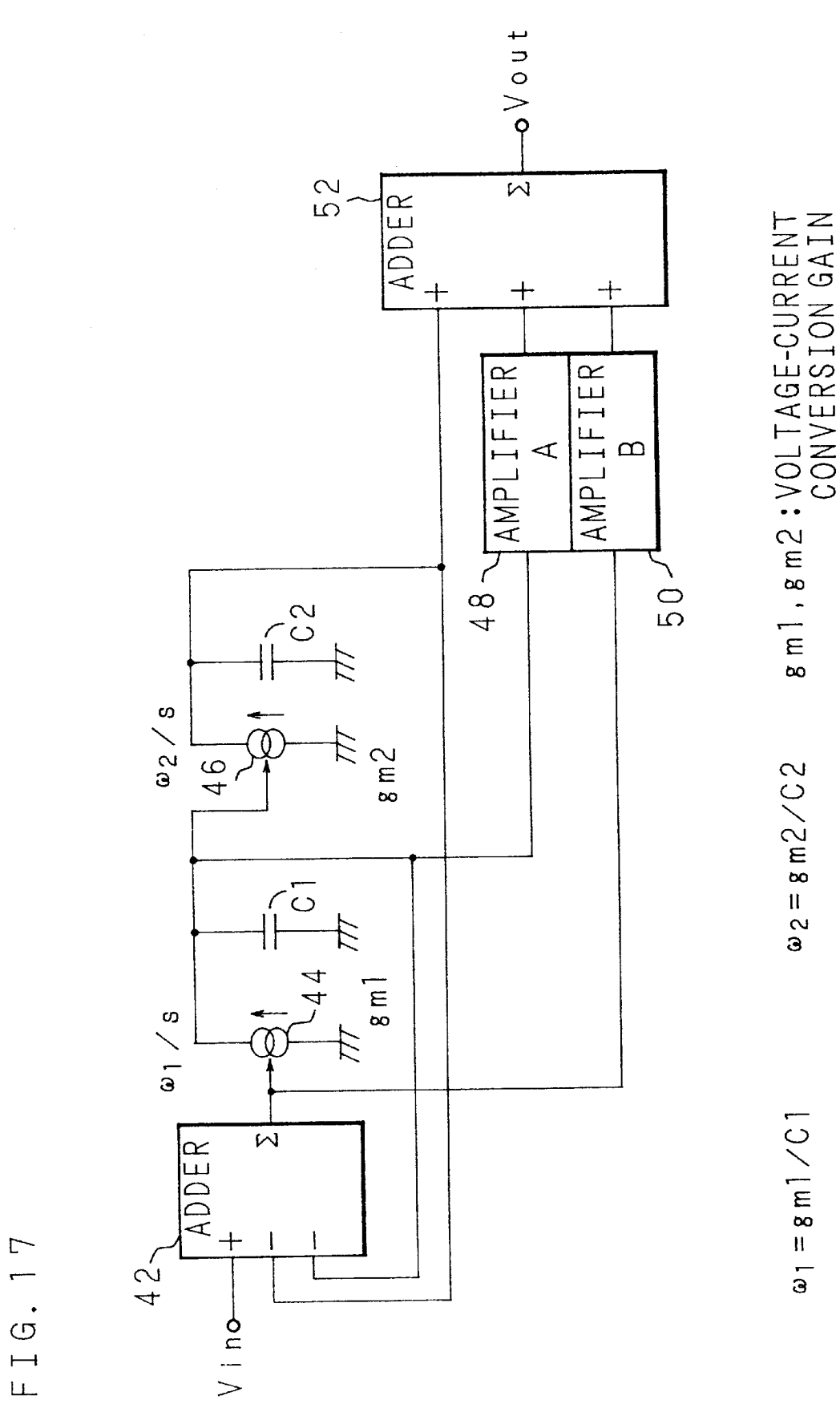
FIG. 17 is a circuit diagram showing a constitution example of a status variable type circuit.

FIG. 17 is a circuit diagram showing an actual circuit of this status variable type circuit, which employs a gm type integrator where frequency characteristic varies in accordance with voltage-current conversion gain. In this status variable type circuit, the input signal IN having passed through an adder 42 is supplied to a voltage-current converter 44 (gm amplifier) having a voltage-current conversion gain "gm1" and an amplifier 50 of gain "B". The output current of the voltage-current converter 44 is negatively fed back to the adder 42, and is also supplied to a capacitance C1 whose other side is grounded, a voltage-current converter 46 (gm amplifier) having a voltage-current conversion gain "gm2", and an amplifier 48 of gain "A".

The output current of the voltage-current converter 46 is negatively fed back to the adder 42, and is also supplied to a capacitance C2 whose other side is grounded and an adder 52. The adder 52 adds the inputs from the amplifies 48, 58 and voltage-current converter 46, and outputs the result as an output signal of the status variable type circuit.

In this circuit diagram and the block diagram shown in FIG. 16, the adder 42 corresponds to the adder 30, the voltage-current converter 44 and capacitance C1 to the transfer element 32, the voltage-current converter 46 and capacitance C2 to the transfer element 34, the amplifier 48 to the amplifier 36, the amplifier 50 to the amplifier 38, and the adder 52 to the adder 40, respectively. Moreover, between this circuit and the block diagram shown in FIG. 16, there is a relation of "$\omega_1 = gm1/C1$", "$\omega_2 = gm2/C2$".

[Fourth Embodiment]

Figure 18:
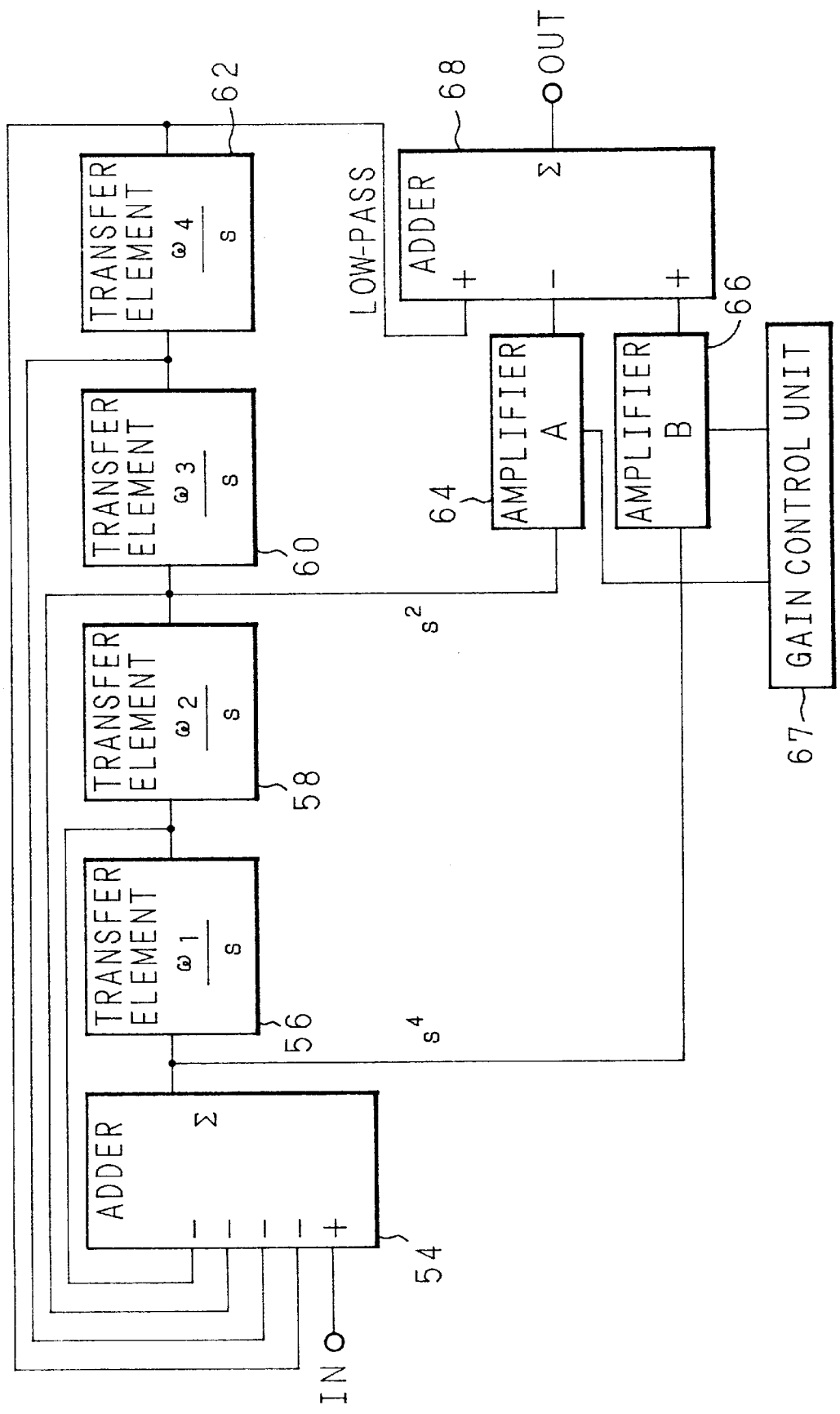
FIG. 18 is a block diagram showing a constitution of an embodiment according to fifth and sixth aspects of a boost type equalizing circuit according to the invention.

FIG. 18 is a block diagram showing a constitution of an embodiment of fifth and sixth aspects of a boost type equalizing circuit of the invention. In this boost type equalizing circuit, the input signal IN having passed through an adder 54 is supplied to a transfer element 56 of transfer function "$\omega_1/s$", and an amplifier 66 of gain "B" as an output of high-pass filter. The output of the transfer element 56 is negatively fed back to the adder 54, and is also supplied to a transfer element 58 of transfer function "$\omega_2/s$".

The output of the transfer element 58 is negatively fed back to the adder 54, and is also supplied to a transfer element 60 of transfer function "$\omega_3/s$", and an amplifier 64 of gain "A" as an output of a band pass filter. The output of the transfer element 60 is negatively fed back to the adder 54, and is also supplied to a transfer element 62 of transfer function "$\omega_4/s$".

The output of the transfer element 62 is negatively fed back to the adder 54, and is also supplied to an adder 68 as an output of low-pass filter. The adder 68 adds the inputs from the amplifiers 64, 66 and transfer element 62, and outputs the result as an output signal OUT of the boost type equalizing circuit.

The gains "A", "B" of the amplifiers 64, 66 are boost coefficients of square of s and fourth power of s, being independently controlled by a gain control unit 67.

This boost type equalizing circuit can take out outputs of the low-pass filter, band pass filter, and high-pass filter simultaneously.

The boost characteristic of this boost type equalizing circuit is expressed by the numerator of a following transfer function.

$$\frac{(1 - A^*s^2 + B^*s^4)^* \omega_a^{2*}\omega_b^2}{(s^2 + Q_a/\omega_a{}^*s + \omega_a^2)^*(s^2 + Q_b/\omega_b{}^*s + \omega_b^2)}$$

where, $\omega_1 = \omega_a/Q_a + \omega_b/Q_b$
$\omega_2 = \{\omega_a^2 + \omega_b^2 + (\omega_a/Q_a)^*(\omega_a/Q_b)\}/\omega_1$
$\omega_3 = \{\omega_a^{*}\omega_b^2/Q_a + \omega_b^{*}\omega_a^2/Q_b\}/\omega_1/\omega_2$
$\omega_4 = (\omega_b^{2*}\omega_a^2)/\omega_1/\omega_2/\omega_3$

[Fifth Embodiment]

Figure 19:
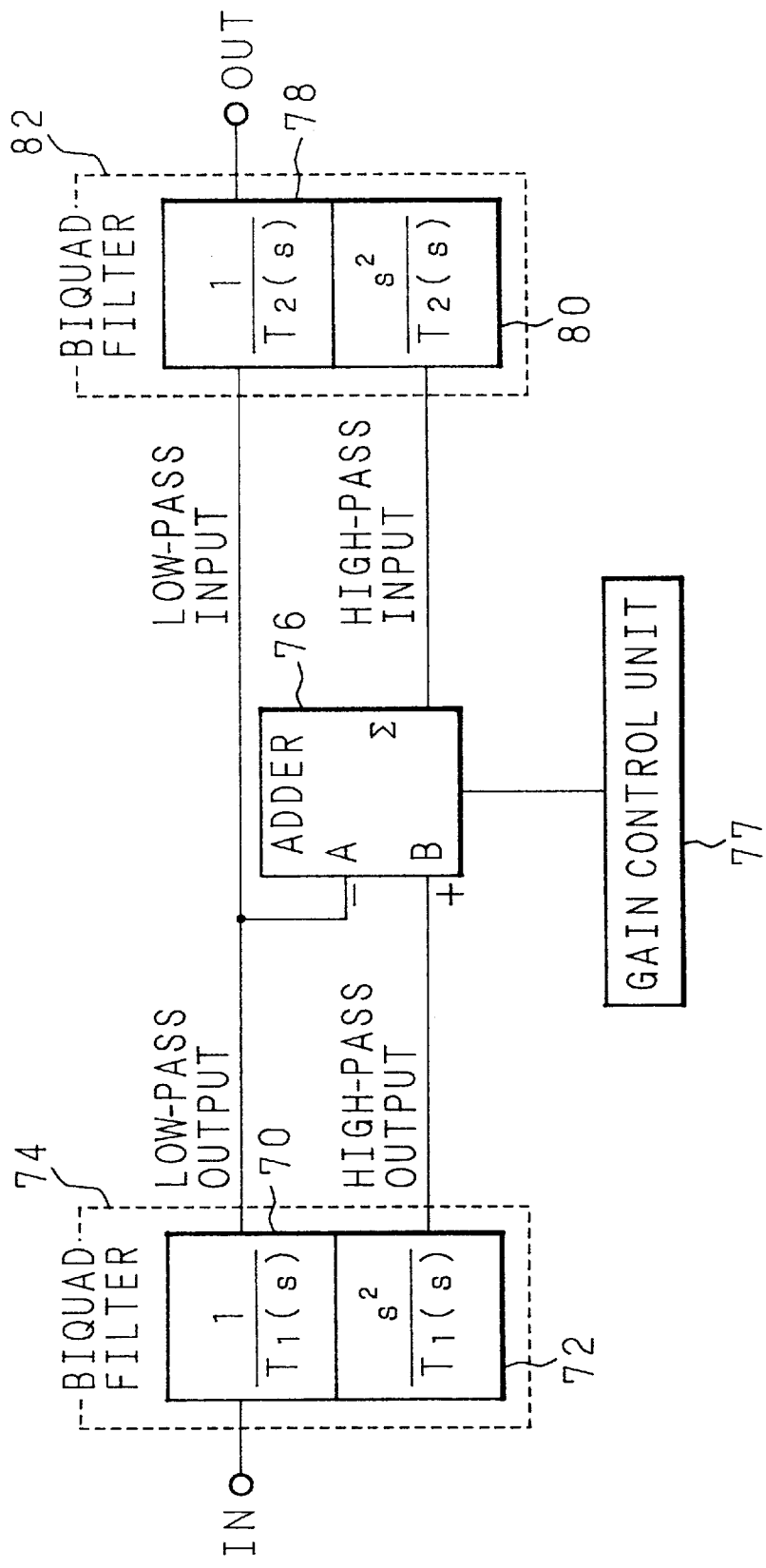
FIG. 19 is a block diagram showing a constitution of an embodiment according to a seventh aspect of a boost type equalizing circuit according to the invention.

FIG. 19 is a block diagram showing a constitution of one embodiment of a seventh aspect of a boost type equalizing circuit of the invention. In this boost type equalizing circuit, two stages of biquad filter are used, and the biquad filter can take out the outputs of the low-pass filter and high-pass filter (also band pass filter) simultaneously. By changing the input point, moreover, the output of either low-pass filter or high-pass filter (or band pass filter) can be selected.

In the boost type equalizing circuit, an input signal IN is inputted to a biquad filter 74. From a transfer element 70 of transfer function "$1/T_1(s)$" ("$T_1(s)$" is an arbitrary quadratic transfer function) in the biquad filter 74, the output of the low-pass filter is supplied to a transfer element 78 of transfer function "$1/T_2(s)$" ("$T_2(s)$" is an arbitrary quadratic transfer function) which is a low-pass filter portion in a biquad filter 82, and an amplifying portion of gain "A" in an adder 76.

From a transfer element 72 of transfer function "$s^2/T_1(s)$" in the biquad filter 74, the output of the high-pass filter is supplied to an amplifying portion of gain "B" in the adder 76. In the adder 76, the difference between the input from the transfer element 72 amplified by gain "B" and the input from the transfer element 70 amplified by gain "A" is obtained, and the obtained difference is supplied to a transfer element 80 of transfer function "$s^2/T_2(s)$" which is a high-pass filter portion in the biquad filter 82. The biquad filter 82 outputs a synthesized output of the transfer elements 78, 80 as an output signal OUT of the boost type equalizing circuit.

The gains "A", "B" of the adder 76 are boost coefficients of square and fourth power of s controlled independently by a gain control unit 77.

The boost characteristic of this boost type equalizing circuit is expressed by the numerator of a following transfer function.

$$\frac{1 - A^*s^2 + B^*s^4}{T_1(s)^*T_s(s)}$$

Figure 20:
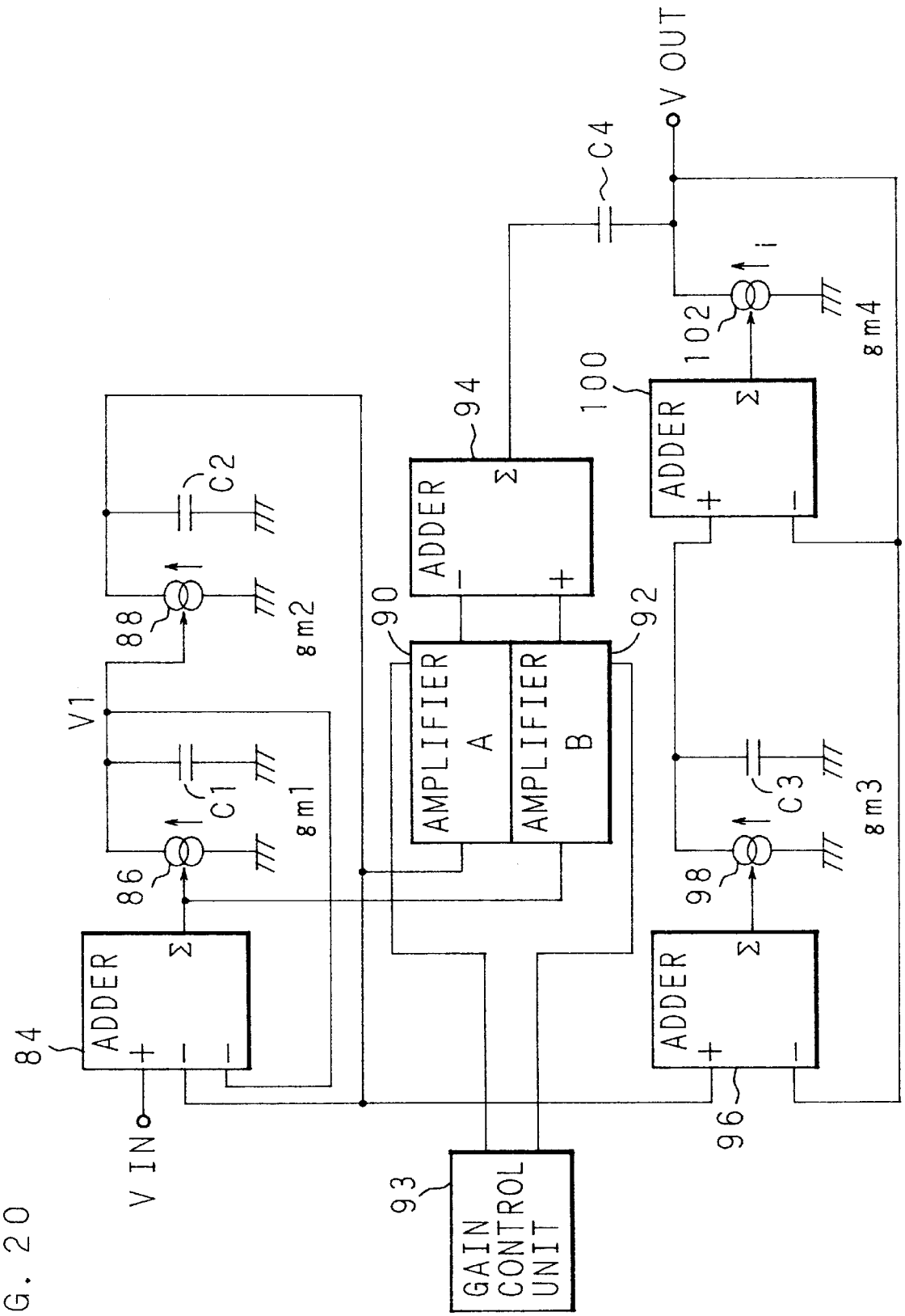
FIG. 20 is a circuit diagram showing one circuit example of the boost type equalizing circuit shown in FIG. 19.

FIG. 20 is a circuit diagram showing an actual circuit of this boost type equalizing circuit, which employs a gm type filter where frequency characteristic is varied in accordance with voltage-current conversion gain. In this boost type equalizing circuit, the input signal IN having passed through an adder 84 is supplied to a voltage-current converter 86 (gm amplifier) having a voltage-current conversion gain "gm1" and an amplifier 92 of gain "B".

The output current of the voltage-current converter 86 is negatively fed back to the adder 84, and is also supplied to a capacitance C1 whose other side is grounded, and a voltage-current converter 88 (gm amplifier) having a voltage-current conversion gain "gm2".

The output current of the voltage-current converter 88 is negatively fed back to the adder 84, and is also supplied to a capacitance C2 whose other side is grounded, an amplifier 90 of gain "A", and an adder 96. The output of the adder 96 is supplied to a voltage-current converter 98 (gm amplifier) having a voltage-current conversion gain "gm3", and the output current of the voltage-current converter 98 is supplied to a capacitance C3 whose other side is grounded, and an adder 100. The difference of the output of the amplifier 92 and the output of the amplifier 90 is obtained in an adder 94.

The output of the adder 100 is supplied to a voltage-current converter 102 (gm amplifier) having a voltage-current conversion gain "gm4", and the output current of the voltage-current converter 102 is negatively fed back to the adder 100 and adder 96, and is also supplied to a capacitance C4 whose other side is connected to the output terminal of the adder 94, and outputted as an output signal OUT of the boost type equalizing circuit.

The gains "A", "B" of the amplifies 90, 92 are boost coefficients of square and fourth power of s, controlled independently by a gain control unit 93.

Figure 21:
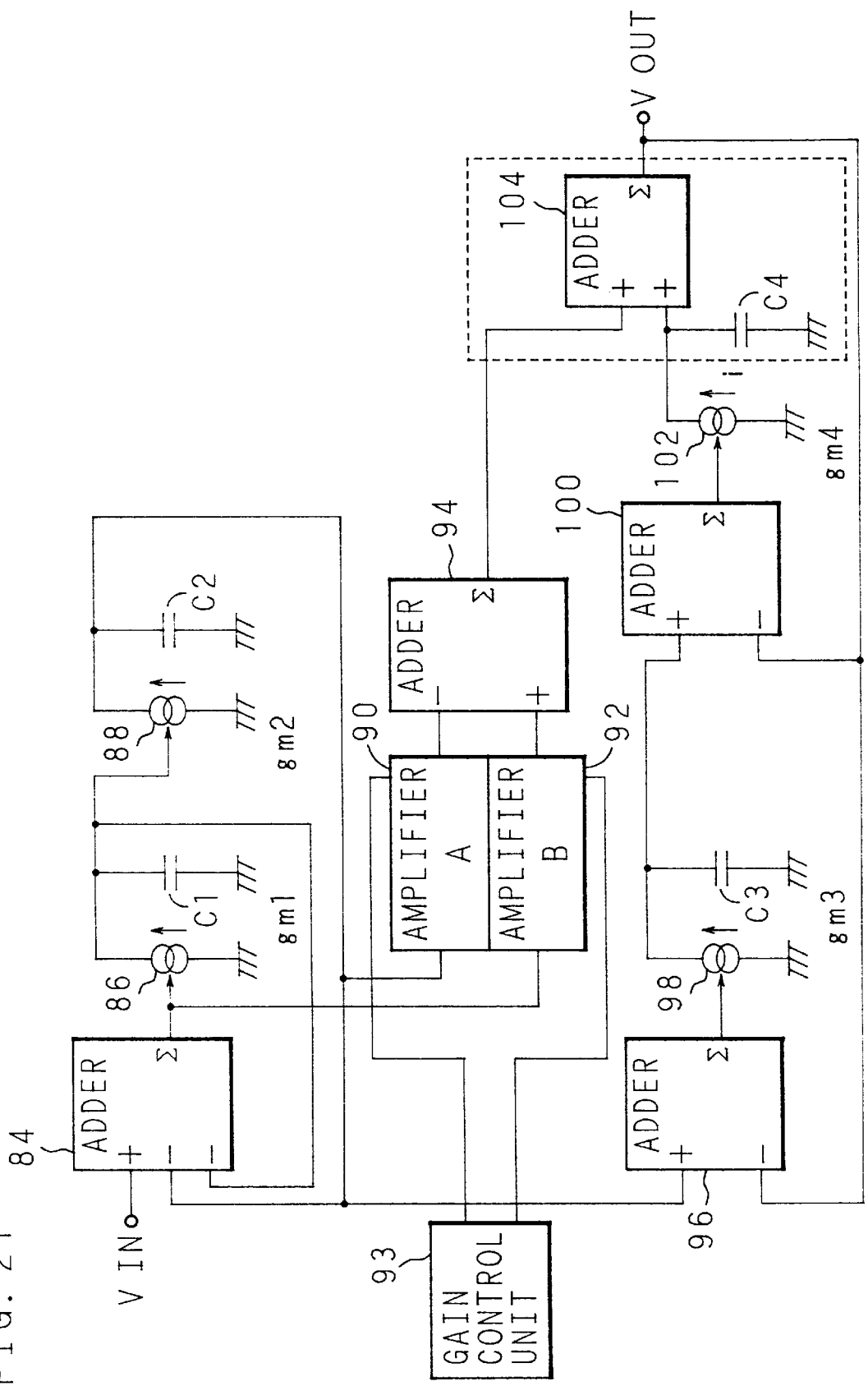
FIG. 21 is a circuit diagram showing another circuit example of the boost type equalizing circuit shown in FIG. 19.
Figure 22A:
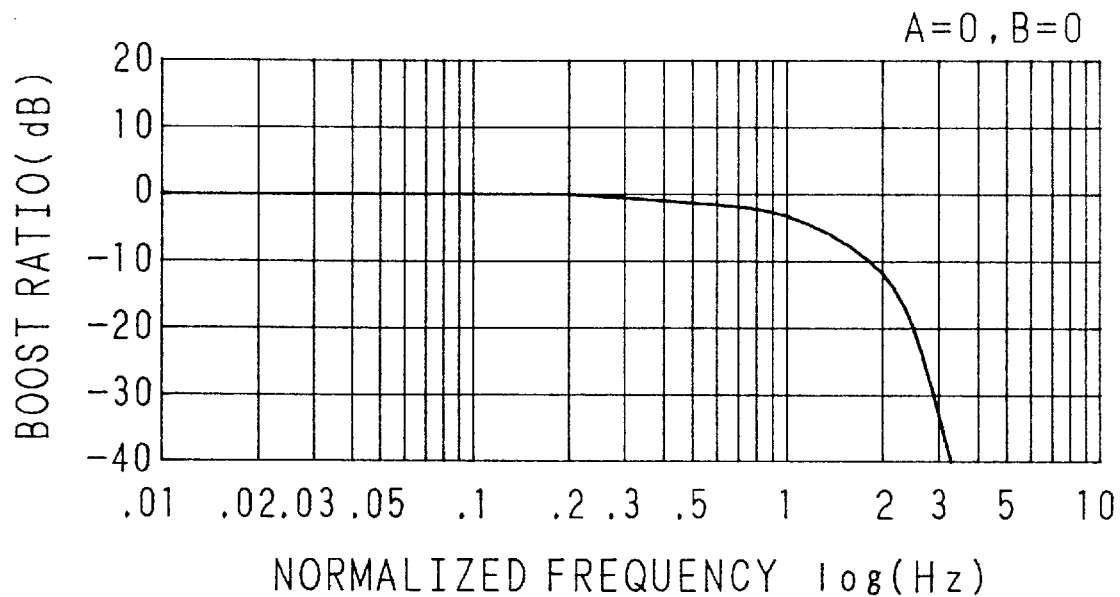
FIG. 22A and FIG. 22B are characteristic diagrams showing characteristics of the boost type equalizing circuit shown in FIG. 19.
Figure 22B:
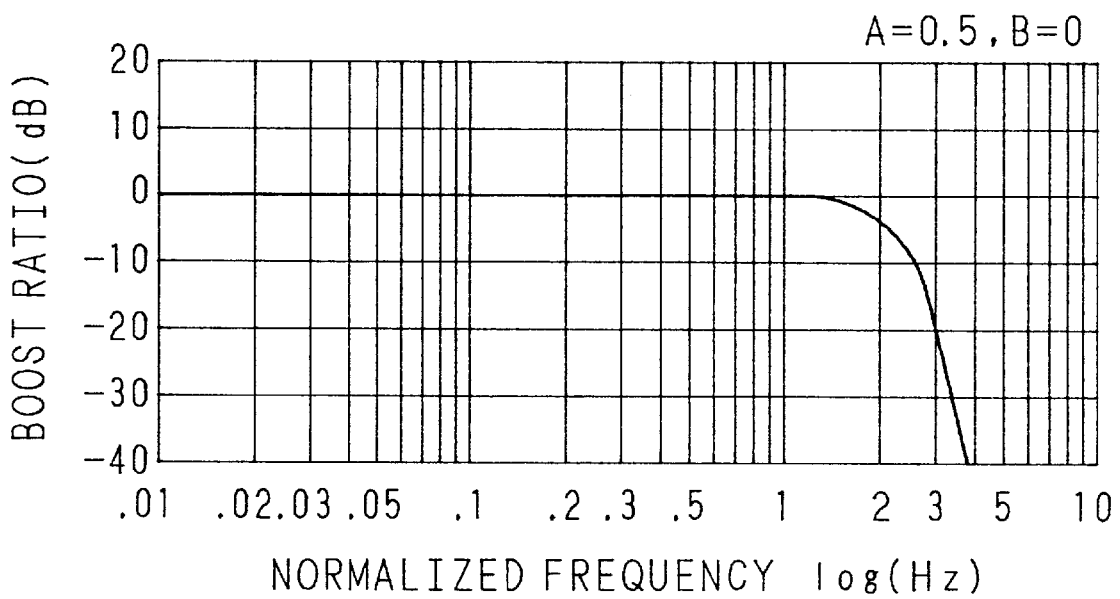
Figure 23A:
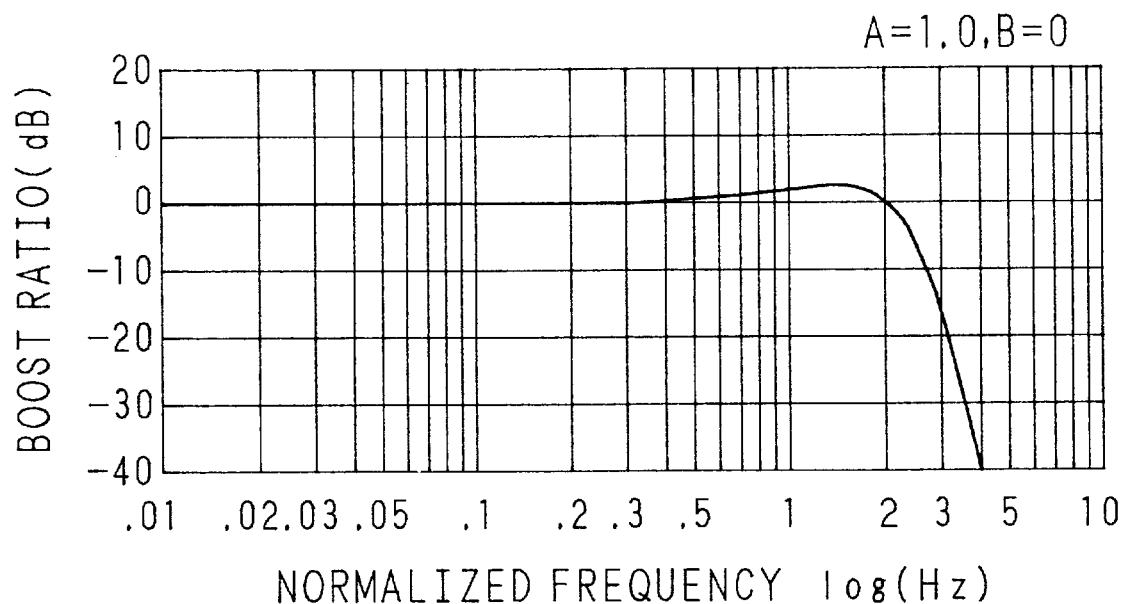
FIG. 23A and FIG. 23B are characteristic diagrams showing characteristics of the boost type equalizing circuit shown in FIG. 19.
Figure 23B:
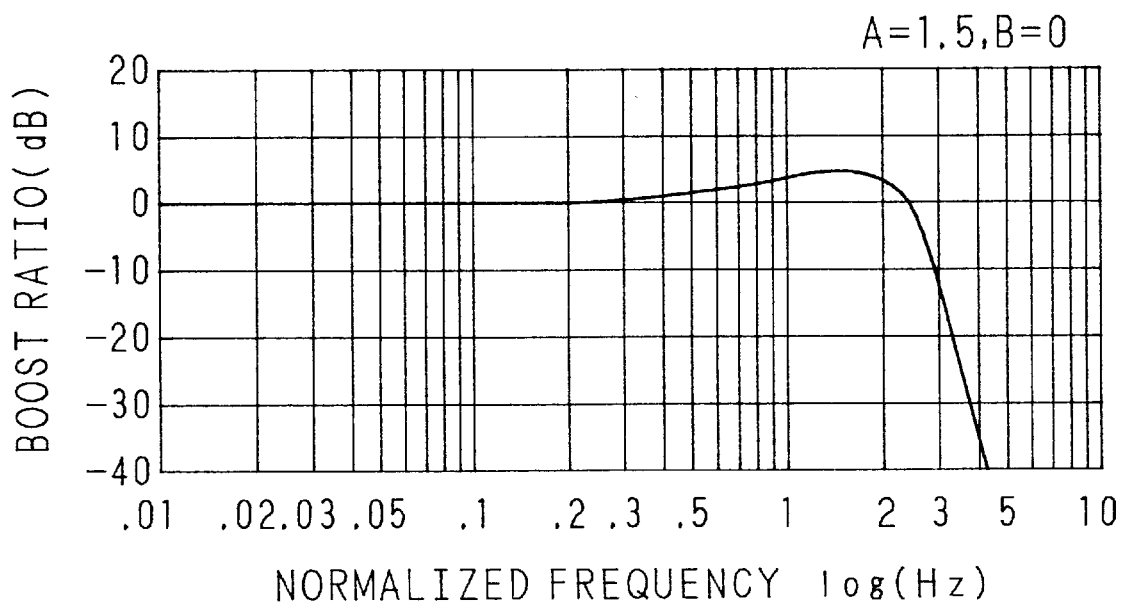
Figure 24A:
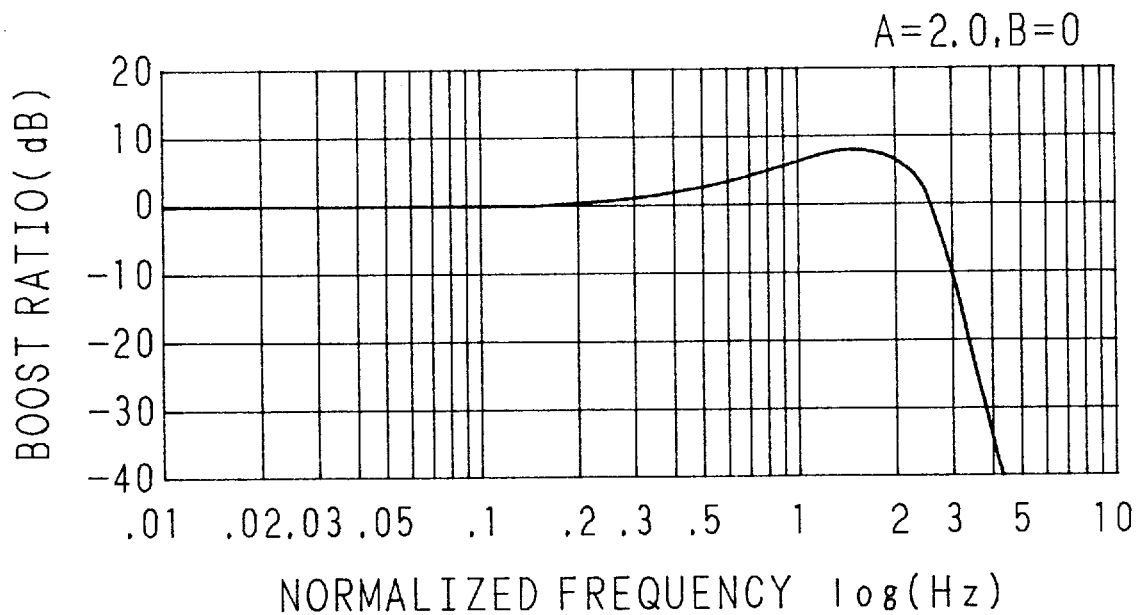
FIG. 24A and FIG. 24B are characteristic diagrams showing characteristics of the boost type equalizing circuit shown in FIG. 19.
Figure 24B:
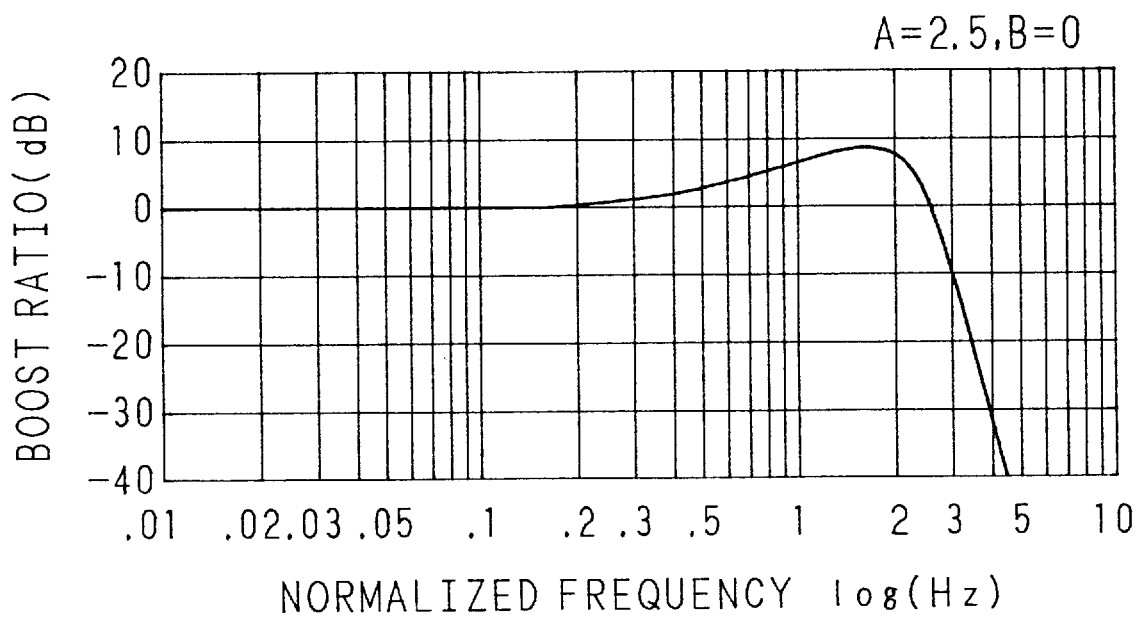
Figure 25A:
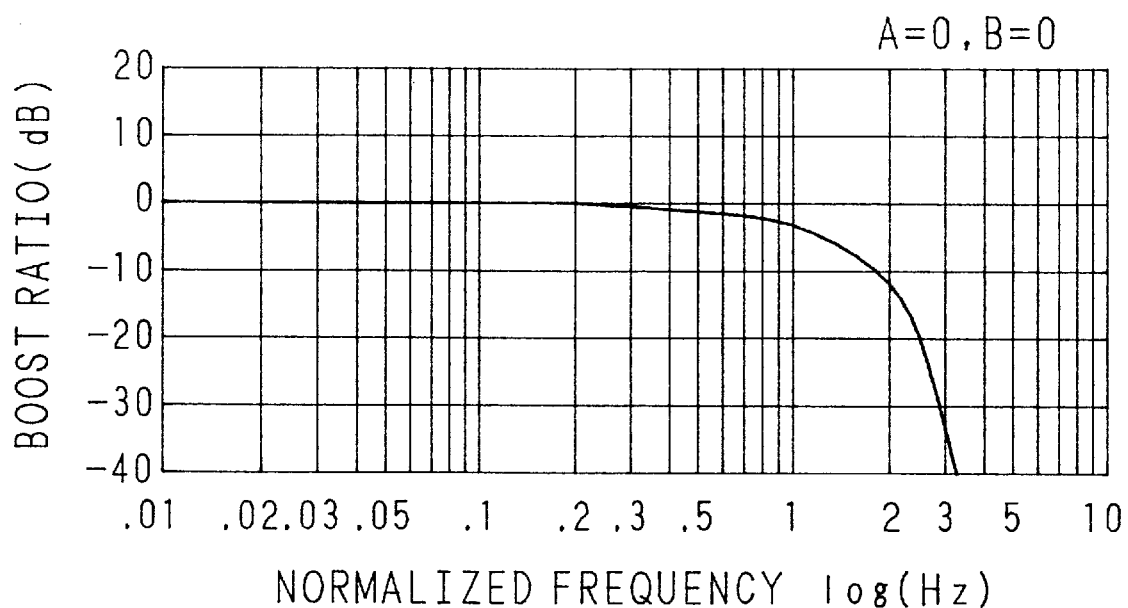
FIG. 25A and FIG. 25B are characteristic diagrams showing characteristics of the boost type equalizing circuit shown in FIG. 19.
Figure 25B:
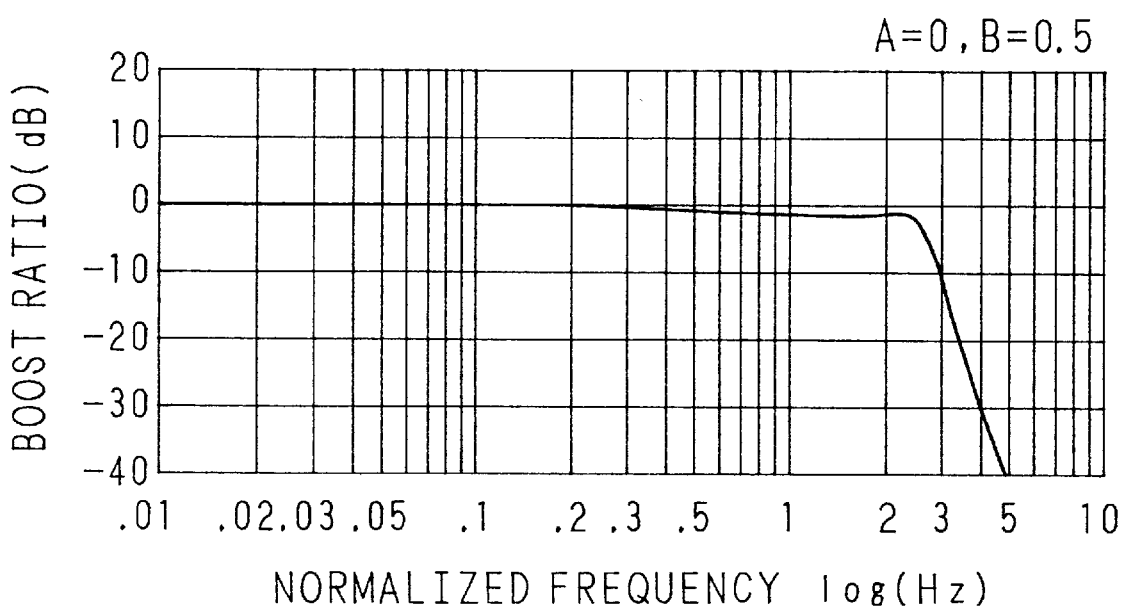
Figure 26A:
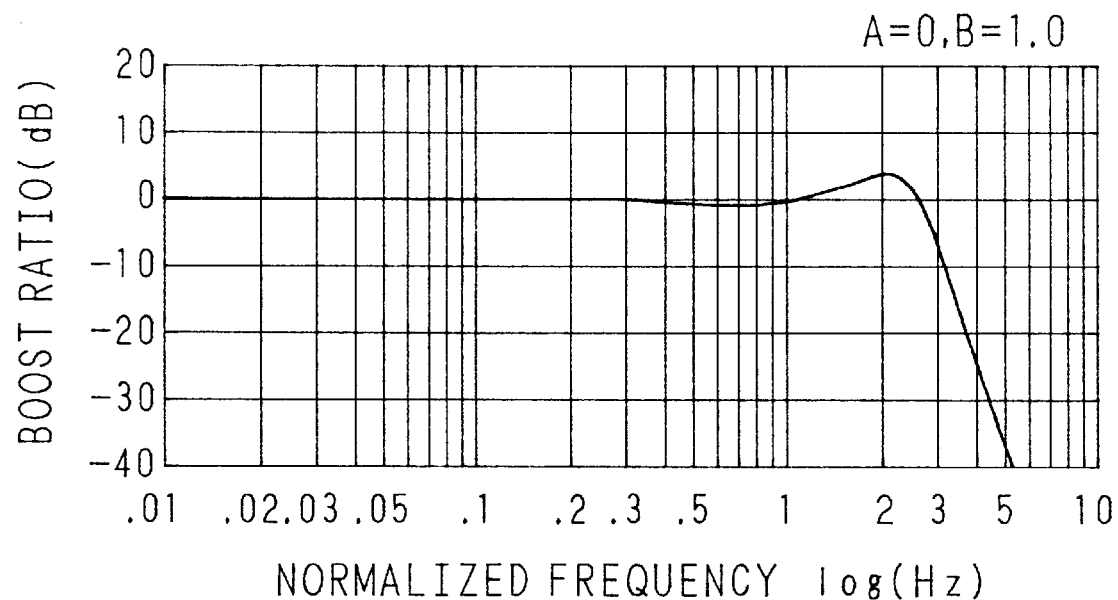
FIG. 26A and FIG. 26B are characteristic diagrams showing characteristics of the boost type equalizing circuit shown in FIG. 19.
Figure 26B:
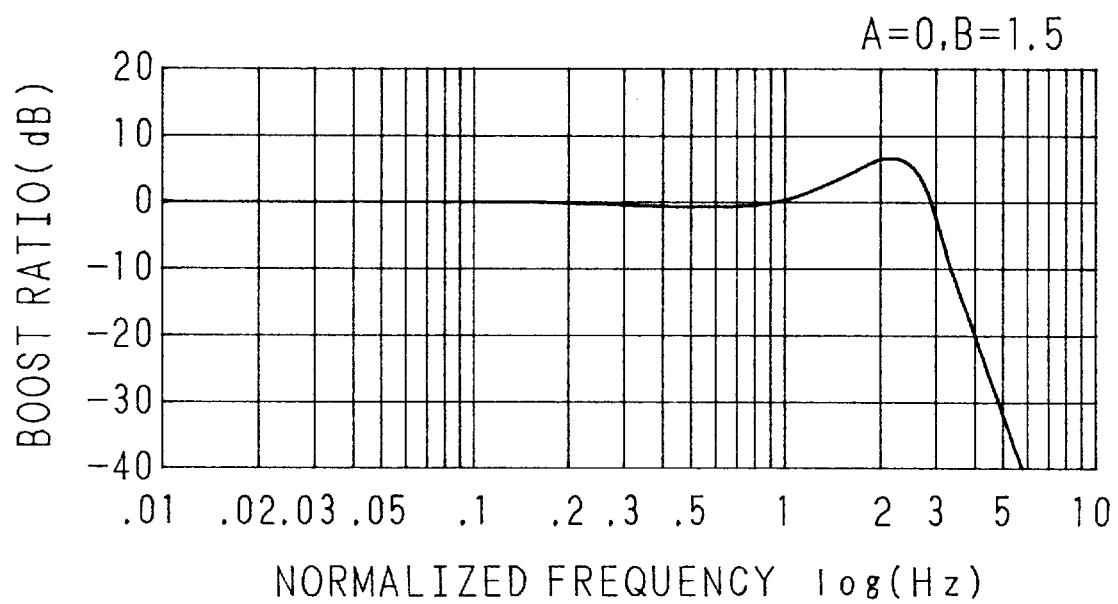

FIG. 21 is a circuit diagram showing another actual circuit of the boost type equalizing circuit. In this boost type equalizing circuit, the output of the adder 94 is supplied to an adder 104. The output current of the voltage-current converter 102 is supplied to the adder 104 and the capacitance C4 whose other side is grounded, and the V-Out of the adder 104 is negatively fed back To the adders 100 and 96.

In the adder 104, the inputs from the adder 94 and the voltage-current converter 102 are added, and the added result is outputted as an output signal OUT of the boost type equalizing circuit. The other constitution is same as that of the boost type equalizing circuit shown in FIG. 20, and duplicated explanation is omitted.

FIG. 22A, FIG. 22B, FIG. 23A, FIG. 23B, and FIG. 24A, FIG. 24B showing the frequency characteristic of the boost type equalizing circuit shown in FIG. 19, characteristic diagrams with two gains of the adder 76 being "A" varied from 0 to 2.5 at 0.5 steps and "B=0". The axis of abscissas denotes the normalized frequency, and the axis of ordinates represents the boost ratio. The larger the gain "A", the better is the boost characteristic in the high frequency range, and the cut-off frequency is also improved as the changing angle becomes acute.

Figure 27A:
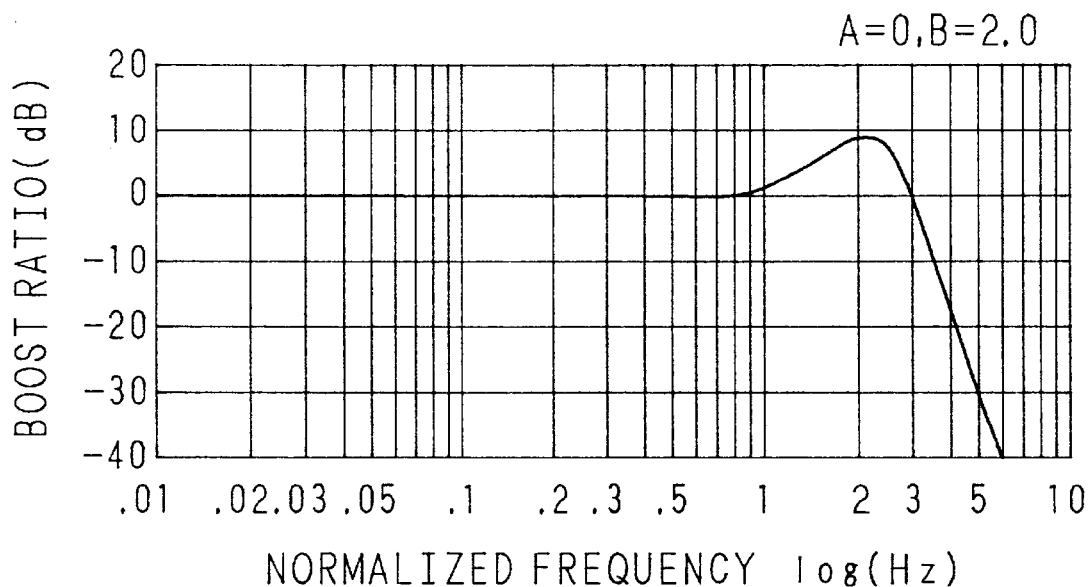
FIG. 27A and FIG. 27B are characteristic diagrams showing characteristics of the boost type equalizing circuit shown in FIG. 19.
Figure 27B:
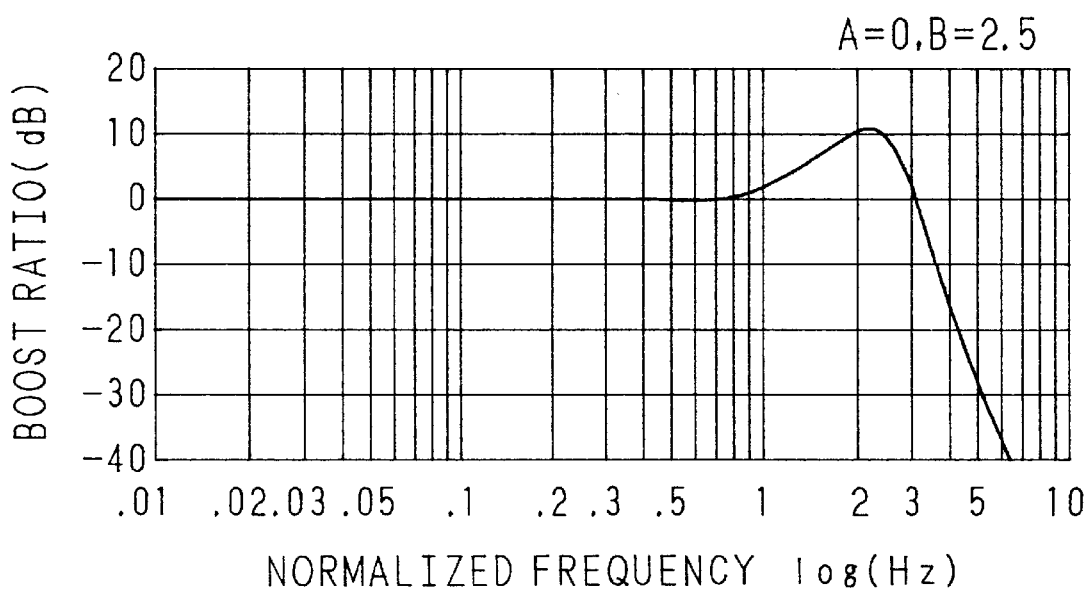
Figure 29A:
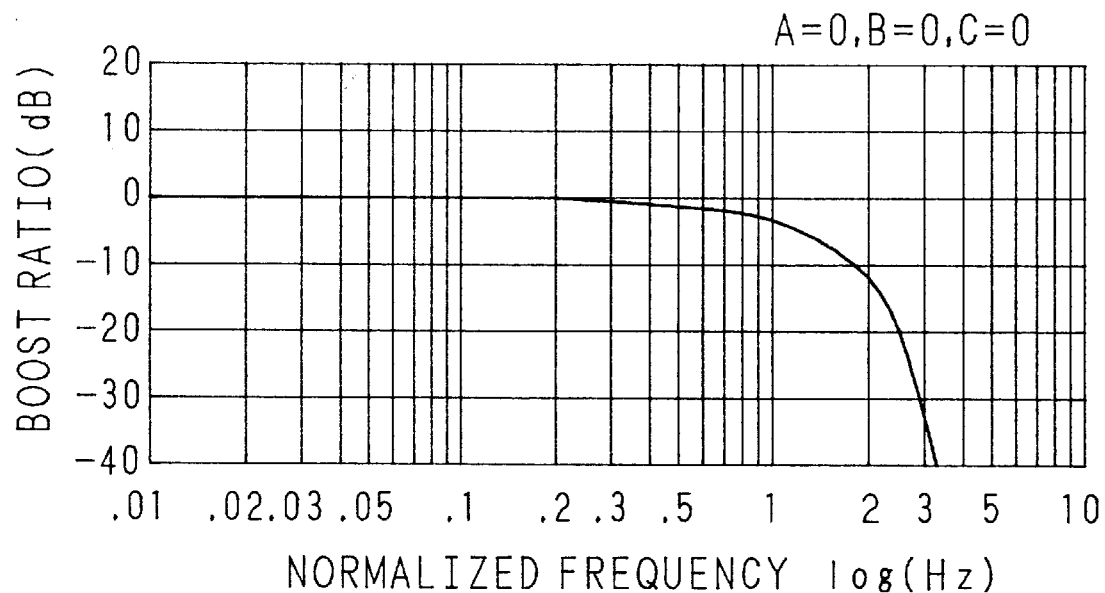
FIG. 29A and FIG. 29B are characteristic diagrams showing characteristics of the boost type equalizing circuit shown in FIG. 28.
Figure 29B:
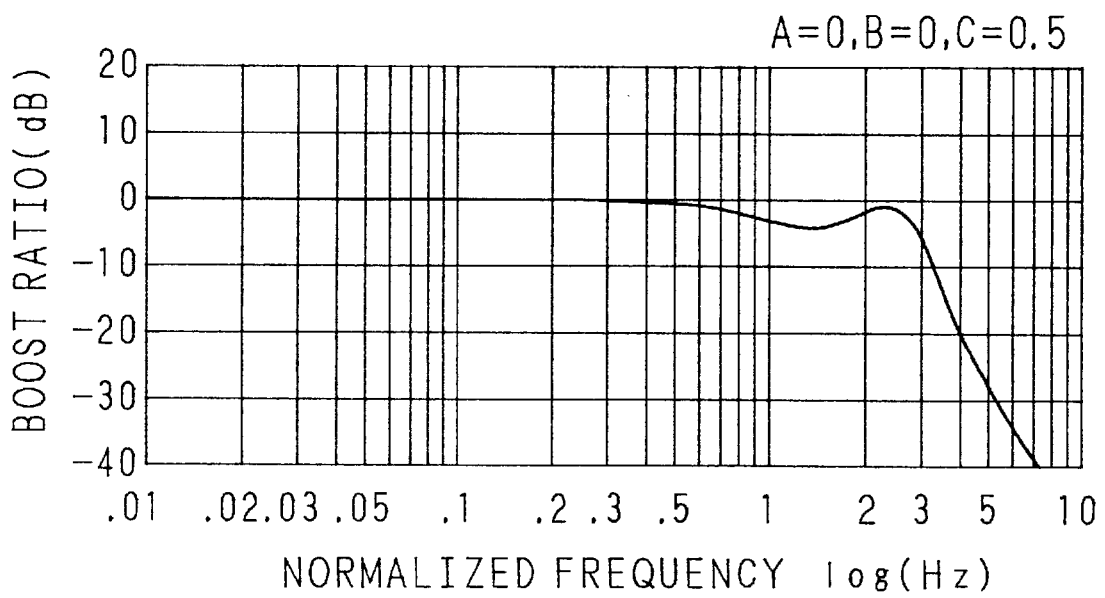
Figure 30A:
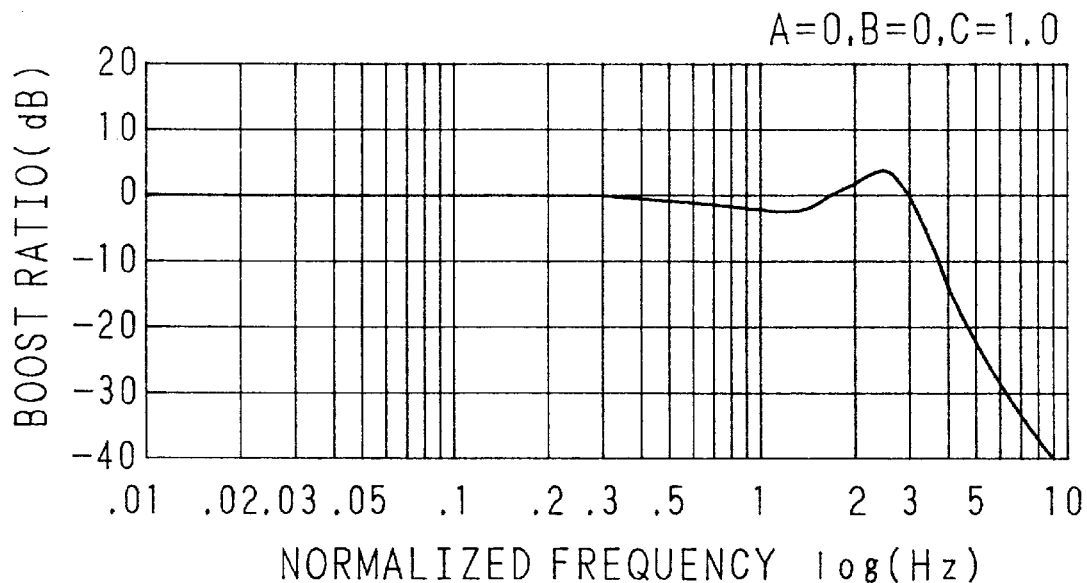
FIG. 30A and FIG. 30B are characteristic diagrams showing characteristics of the boost type equalizing circuit shown in FIG. 28.
Figure 30B:
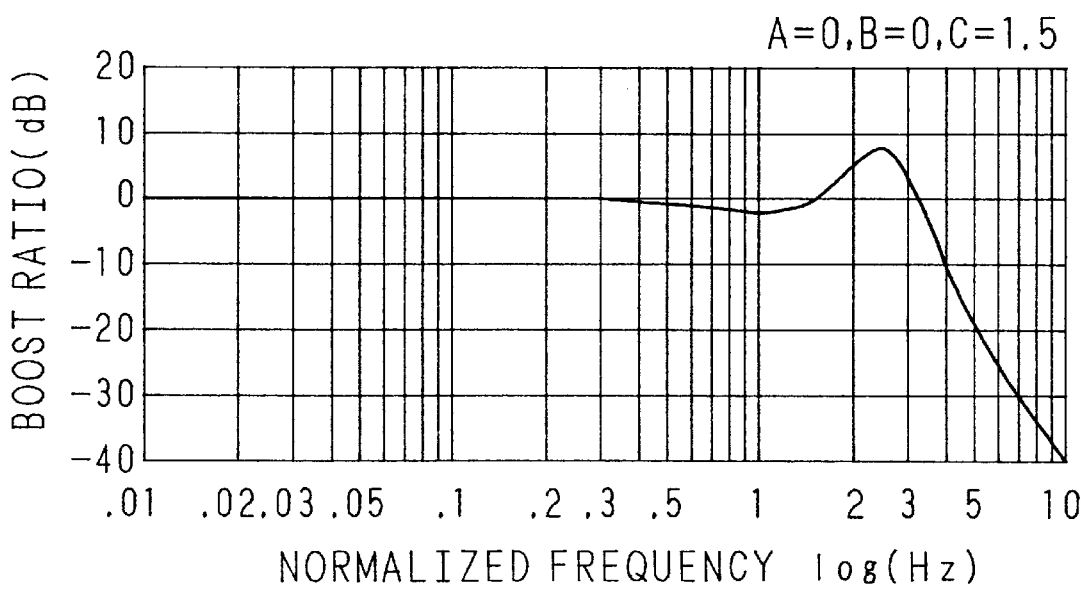

FIG. 25A, FIG. 25B, FIG. 26A, FIG. 26B, FIG. 27A and, FIG. 27B are characteristic diagrams with two gains of the adder 76 being "A=0", and "B" varied from 0 to 2.5 at 0.5 steps. The larger the gain "B", the better is the boost characteristic in the high frequency range.

[Sixth Embodiment]

FIG. 28 is a block diagram showing a constitution of one embodiment of an eighth aspect of a boost type equalizing circuit of the invention. In this boost type equalizing circuit, a boost characteristic of the sixth power of "ω" is realized by combining the boost type equalizing circuits of the fourth and fifth embodiments, and two stages of biquad filters. The biquad filters can take out the outputs of a low-pass filter and a high-pass filter (also band pass filter) simultaneously. By changing the input point, moreover, the output of either the low-pass filter or the high-pass filter (or band pass filter) can be selected.

In the boost type equalizing circuit, an input signal IN is supplied to a biquad filter 112. From a transfer element 106 of transfer function "$1/T_1(s)*T_2(s)$" ("$T_1(s)$" and "$T_2(s)$" are arbitrary quadratic transfer functions) in the biquad filter 112, the output of the low-pass filter is supplied to a transfer element 116 of transfer function "$1/T_3(s)$" ("$T_3(s)$" is an arbitrary quadratic transfer function) which is a low-pass filter portion in a biquad filter 120, and an amplifying portion of gain "A" in an adder 114.

From a transfer element 108 of transfer function "$s^2/T_1(s)*T_2(s)$" in the biquad filter 112, the output of the high-pass filter is supplied to an amplifying portion of gain "B" in the adder 114.

The output from a transfer element 110 of transfer function "$s^4/T_1(s)*T_2(s)$" in the biquad filter 112 is supplied to an amplifying portion of gain "C" in the adder 114.

In the adder 114, from the input from the transfer element 108 amplified by gain "B", the input from the transfer element 106 amplified by gain "A" and the input from the transfer element 110 amplified by gain "C" are subtracted. The output of the adder 114 is supplied to a transfer element 118 of transfer function "$s^2/T_3(s)$" which is a high-pass filter portion in the biquad filter 120. The biquad filter 120 outputs a synthesized output of the transfer elements 116, 118 as an output signal OUT of the boost type equalizing circuit.

The gains "A", "B", "C" of the adder 114 are boost coefficients of square, fourth power, and sixth power of s, controlled independently by a gain control unit 115.

The boost characteristic of this boost type equalizing circuit is expressed by the numerator of a following transfer function.

$$\frac{1 - A^*s^2 + B^*s^4 - Cs^4}{\{1/T_1(s)\}*\{1/T_2(s)\}*\{1/T_3(s)\}}$$

Figure 31A:
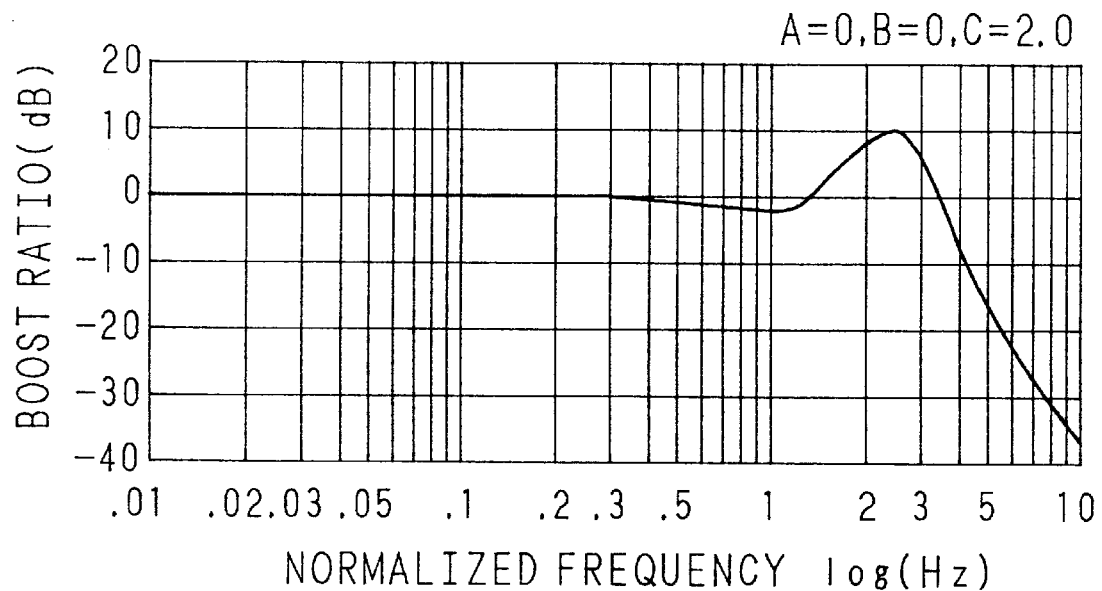
FIG. 31A and FIG. 31B are characteristic diagrams showing characteristics of the boost type equalizing circuit shown in FIG. 28.
Figure 31B:
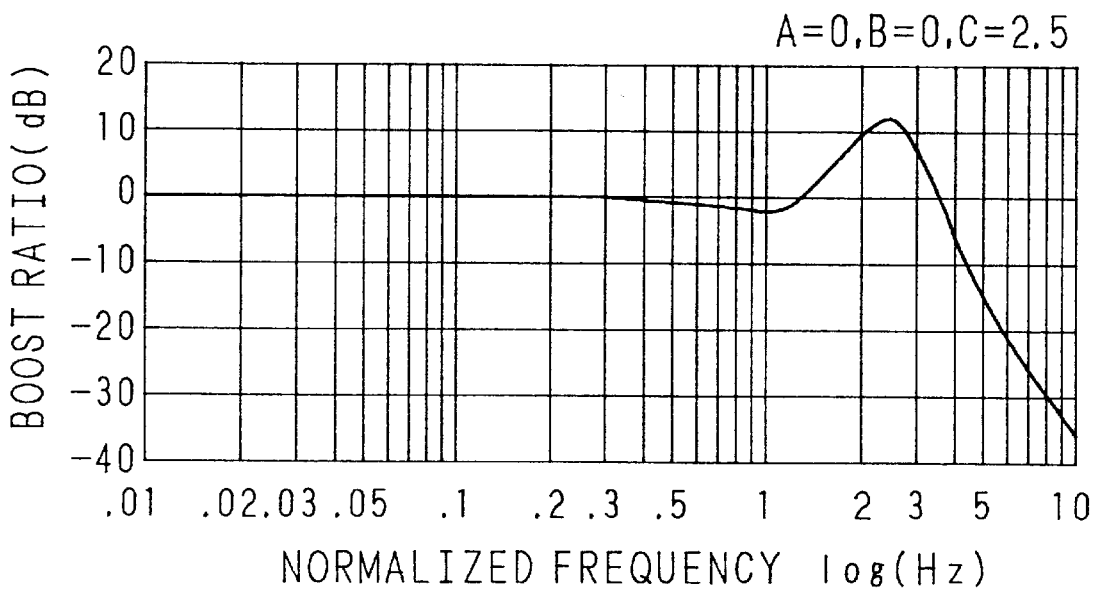

FIG. 29A, FIG. 29B, FIG. 30A, FIG. 30B, FIG. 31A and, FIG. 31B showing the frequency characteristic of the boost type equalizing circuit shown in FIG. 28, are characteristic diagrams with three gains of the adder 114 being "A=0", "B=0", and "C" varied from 0 to 2.5 at 0.5 steps. The axis of abscissas denotes the normalized frequency, and the axis of ordinates represents the boost ratio. The larger the gain "C", the better is the boost characteristic in the high frequency range.

As known from FIG. 22 to FIG. 27, and FIG. 21 to FIG. 31, the changing angle of the cut-off characteristic becomes sharper in the sequence of gains "A", "B", "C", and it is known that the contribution to improvement of cut-off characteristic is very high.

[Seventh Embodiment]

Figure 32:
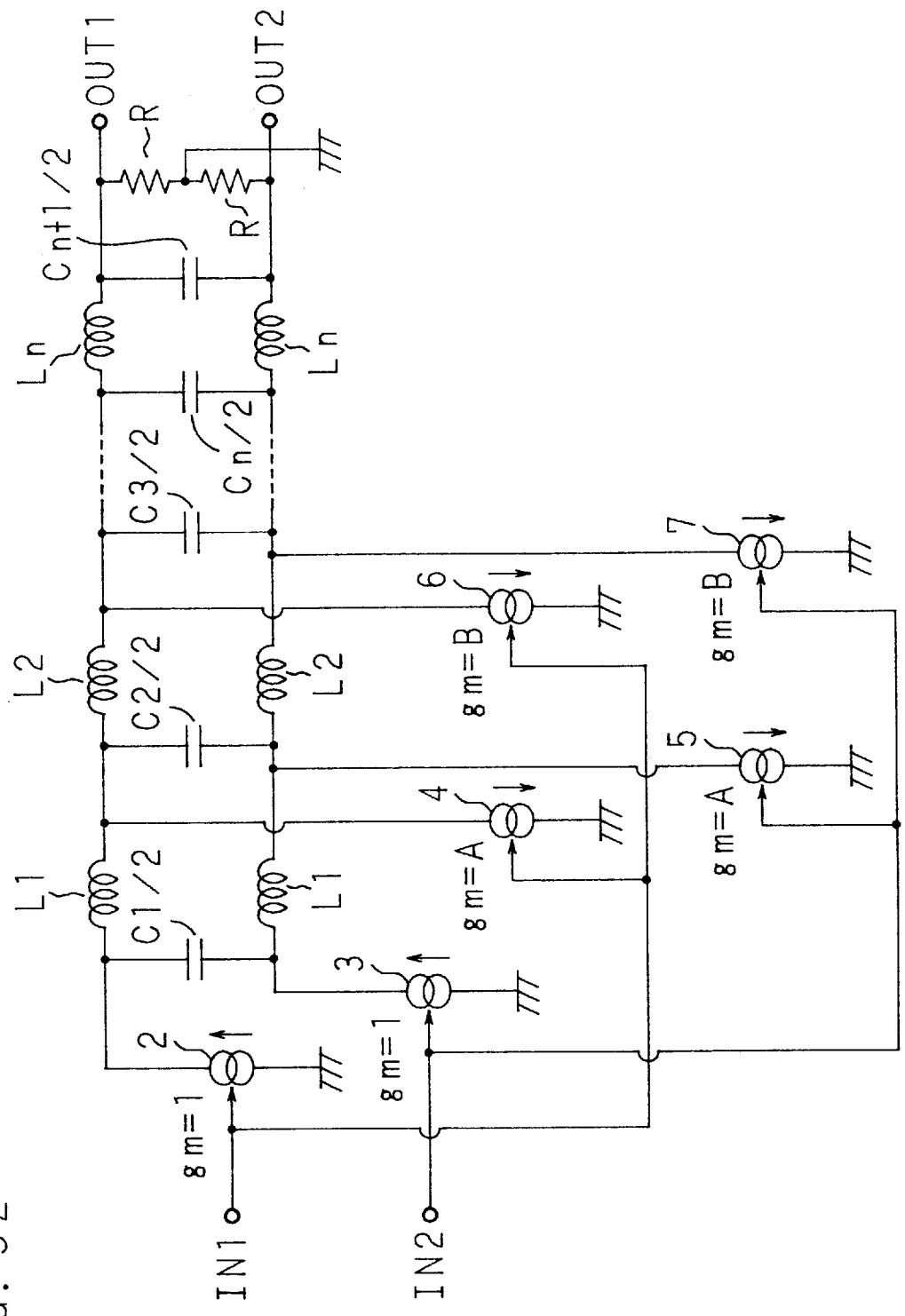
FIG. 32 is a circuit diagram showing a constitution of an embodiment according to a ninth aspect of a boost type equalizing circuit according to the invention.

FIG. 32 is a circuit diagram showing a constitution of an embodiment of a ninth aspect of a boost type equalizing circuit of the invention. This boost type equalizing circuit is obtained by composing the boost type equalizing circuit shown in FIG. 7 in a differential circuit, in which an input signal IN is supplied to a portion between input terminals IN1 and IN2, and the voltage of the input terminal IN1 is supplied to a voltage-current converter 2 having a voltage-current conversion gain "gm=1", a voltage-current converter 4 having a voltage-current conversion gain "gm=A", and a voltage-current converter 6 having a voltage-current conversion gain "gm=B".

The output current of the voltage-current converter 2 is supplied to a connection node of L1 and C1/2 (the capacitance is made to be ½ that of the case in FIG. 7) of one side of a first stage of a ladder circuit composed of a capacitance C of the horizontal beam of a ladder and inductances L disposed at both sides. The output current of the voltage-current converter 4 is supplied to a connection node of L1 of one side of the first stage of the ladder circuit and C2/2 and L2 at one side of a second stage thereof, and the output current of the voltage-current converter 6 is supplied to a connection node of L2 at one side of the second stage of the ladder circuit and C3/2 and L3 of one side of a third stage thereof.

The voltage of the input terminal IN2 is supplied to a voltage-current converter 3 having a voltage-current conversion gain "gm=1", a voltage-current converter a having a voltage-current conversion gain "gm=A", and a voltage-current converter 7 having a voltage-current conversion gain "gm=B".

The voltage-current converter 2 and the voltage-current converter 3 both having voltage-current conversion gain "gm=1" are composed of one differential amplifying circuit, and similarly each of the voltage-current converter 4 and the voltage-current converter 5 both having voltage-current conversion gain "gm=A", and the voltage-current converter 6 and the voltage-current converter 7 both having voltage-current conversion gain "gm=B" is respectively composed of one differential amplifying circuit.

The output current of the voltage-current converter 3 is supplied to a connection node of L1 and C1/2 of the other side of a first stage of a ladder circuit composed of a capacitance C of the horizontal beam of a ladder and inductances L disposed at both sides. The output current of the voltage-current converter 5 is supplied to a connection node of L1 of other side of the first stage of the ladder circuit and C2/2 and L2 at other side of a second stage thereof, and the output current of the voltage-current converter 7 is supplied to a connection node of L2 at the other side of the second stage of the ladder circuit and C3/2 and L3 of the other side of a third stage thereof.

Between the output side of Ln of one side of n-th stage of a ladder circuit composed of capacitance C of the horizontal beam of the ladder and inductances L disposed at both sides, and the output side of Ln of the other side, Cn+1/2 is connected, and both ends of Cn+1/2 are connected to respective resistances R having the other side grounded commonly. The output side of Ln of one side is connected to an output terminal OUT1 of one side, and the output side of Ln of the other side is connected to an output terminal OUT2 of the other side, and the output terminal OUT1 and output terminal OUT2 output signals of mutually opposite phases as output signals OUT of the boost type equalizing circuit.

This boost type equalizing circuit is composed in a differential circuit, and the influence of external noise is canceled between one side and other side and does not appear in the output, and hence the influence of noise is small. The frequency characteristic is same as that in the boost type equalizing circuit shown in FIG. 7, and duplicate explanation is omitted.

According to the boost type equalizing circuit of the first to fourth aspects, a boost type equalizing circuit excellent in the cut-off characteristic in the high frequency range can be realized.

According to the boost type equalizing circuit of the fifth to eighth aspects, a boost type equalizing circuit advanced in the flexibility of equalizing characteristic design and excellent in the cut-off characteristic in the high frequency range can be realized.

According to the boost type equalizing circuit of the ninth aspect, a boost type equalizing circuit small in the noise influence and excellent in the cut-off characteristic in the high frequency range can be realized.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A boost type equalizing circuit having a boost unit for emphasizing the high frequency range, the circuit being used for compensating a distortion caused in a reproduced signal of an information recording medium and for compensating frequency characteristics of the reproduced signal, wherein said boost unit comprises a signal transfer circuit provided such that a numerator of a transfer function thereof has an even-number order term of the fourth power or more of Laplace operator "s".

2. The boost type equalizing circuit as set forth in claim 1, comprising:

a first voltage-current converter, a second voltage-current converter, and a third voltage-current converter, each to be supplied with an input signal; and a ladder circuit of inductance and capacitance;

wherein an output current of said first voltage-current converter is supplied to a connection node of inductance and capacitance of a first stage of said ladder circuit, an output current of said second voltage-current converter is supplied to a connection node of inductance of the first stage and capacitance of a second stage of said ladder circuit, an output current of said third voltage-current converter is supplied to a connection node of inductance of the second stage and capacitance of a third stage of said ladder circuit, and an output signal is outputted from an n-th stage (n being a natural number of 3 or more) of said ladder circuit.

3. The boost type equalizing circuit as set forth in claim 1, comprising:

a first amplifier and a second amplifier, both to be supplied with an input signal; and a ladder circuit of inductance and capacitance;

wherein an output voltage of said first amplifier is supplied to a capacitance of a first stage of said ladder circuit, the output voltage of said second amplifier is supplied to a capacitance of a second stage of said ladder circuit, and an output signal is outputted from an n-th stage (n being natural number of 3 or more) of said ladder circuit.

4. The boost type equalizing circuit as set forth in claim 1, comprising:

a first transfer element having a first transfer function "$1/T_1(s)$" (where "$T_1(s)$" is an arbitrary transfer function), a second transfer element having a second transfer function "$A*s/T_1(s)$" (where "A" is an arbitrary real number), and a third transfer element having a third transfer function "$B*s^2/T_1(s)$" (where "B" is an arbitrary real number), each to be supplied with an input signal;

a first addition point for adding outputs of said first, second, and third transfer elements;

a fourth transfer element having a fourth transfer function "$1/T_2(s)$" (where $T_2(s)$ is an arbitrary transfer function), a fifth transfer element having a fifth transfer function "$-A*s/T_2(s)$", and a sixth transfer element having a sixth transfer function "$B*s^2/T_2(s)$", each to be supplied with an output of said first addition point;

a second addition point for adding outputs of said fourth, fifth, and sixth transfer elements, and a high-order low-pass filter having a high-order transfer function "$1/T_3(s)$", to be supplied with an output of said second addition point;

wherein an output signal is outputted from said high-order low-pass filter.

5. The boost type equalizing circuit as set forth in claim 1, wherein said boost unit has boost coefficient controlling means for independently varying the boost coefficients of the terms of square, fourth power, and sixth power of Laplace operator "s", respectively.

6. The boost type equalizing circuit as set forth in claim 5, further comprising:

a first adder to be supplied with an input signal;

a first amplifier and a first transfer element having a first transfer function "$w_1/s$" (where, "$w_1$" is an arbitrary real number), each to be supplied with an output of said first adder;

a second transfer element having a second transfer function "$w_2/s$" (where, "$w_2$" is an arbitrary real number) to be supplied with an output of said first transfer element;

a second amplifier and a third transfer element having a third transfer function "$w_3/s$" (where, "$w_3$" is an arbitrary real number), each to be supplied with an output of said second transfer element;

a fourth transfer element having a fourth transfer function "$w_4/s$" (where, "$w_4$" is an arbitrary real number) to be supplied with an output of said third transfer element; and a second adder for adding an output of said first amplifier, an output of said fourth transfer element, and an inverted output of said second amplifier;

wherein said boost coefficient controlling means independently controls the boost coefficients of said first amplifier and second amplifier, said outputs of said first, second, third, and fourth transfer elements are negatively fed back to said first adder, and an output signal is outputted from said second adder.

7. The boost type equalizing circuit as set forth in claim 5, further comprising:

a first biquad filter including a first transfer element having a first transfer function "$1/T_1(s)$" (where "$T_1(s)$" is an arbitrary quadratic function) to be supplied with an input signal, and a second transfer element having a transfer second function "$s^2/T_1(s)$";

a second biquad filter including a third transfer element having a third transfer function "$1/T_2(s)$" (where "$T_2(s)$" is an arbitrary quadratic function), and a fourth transfer element having a fourth transfer function "$s^2/T_2(s)$"; and an adder for adding an input signal from said second transfer element boosted by a first boost coefficient, and an inverted input signal from said first transfer element boosted by a second boost coefficient;

wherein said boost coefficient controlling means independently controls said first boost coefficient and said second boost coefficient of said adder, an output of said first transfer element is supplied to said third transfer element, an output of said adder is supplied to said fourth transfer element, and an output signal is outputted from said third transfer element.

8. The boost type equalizing circuit as set forth in claim 5, further comprising:

a first biquad filter including a first transfer element having a first transfer function "$1/T_1(s)*T_2s$" (where "$T_1(s)$" and "$T_2s$" are arbitrary quadratic functions) to be supplied with an input signal, a second transfer element having a second transfer function "$s^2/T_1(s)*T_2s$", and a third transfer element having a third transfer function "$s^4/T_1(s)*T_2s$";

a second biquad filter including a fourth transfer element having a fourth transfer function "$1/T_3(s)$" (where "$T_3(s)$" is an arbitrary quadratic function), and a fifth transfer element having a fifth transfer function "$s^2/T_3(s)$"; and an adder for adding an inverted input signal from said first transfer element boosted by a first boost coefficient, a signal of the input from said second transfer element boosted by a second boost coefficient, and an inverted input signal from said third transfer element boosted by a third boost coefficient;

wherein said boost coefficient controlling means independently controls said first, second and third boost coefficients of said adder, an output of said first transfer element is supplied to said fourth transfer element, an output of said adder is transmitted to said fifth transfer element, and an output signal is outputted from said fourth transfer element.

9. The boost type equalizing circuit as set forth in claim 5, wherein said boost unit has plural differential amplifying circuits, for processing signals of mutually reverse phases.

* * * * *